(12) United States Patent
Kumar

(10) Patent No.: US 7,936,042 B2
(45) Date of Patent: May 3, 2011

(54) FIELD EFFECT TRANSISTOR CONTAINING A WIDE BAND GAP SEMICONDUCTOR MATERIAL IN A DRAIN

(75) Inventor: Arvind Kumar, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/939,017

(22) Filed: Nov. 13, 2007

(65) Prior Publication Data

US 2009/0121258 A1 May 14, 2009

(51) Int. Cl.
*H01L 29/02* (2006.01)
(52) U.S. Cl. ........ 257/487; 257/339; 257/409; 257/616; 257/E29.039
(58) Field of Classification Search ............ 257/19, 257/194, 616, E29.193, 339, 409, 487, E29.039, 257/E29.04, E29.116, E29.277
See application file for complete search history.

(56) References Cited

U.S. PATENT DOCUMENTS

| | | | |
|---|---|---|---|
| 6,297,538 B1 * | 10/2001 | Kolodzey et al. | 257/410 |
| 6,548,842 B1 | 4/2003 | Bulucea et al. | |
| 7,221,006 B2 * | 5/2007 | Orlowski et al. | 257/192 |
| 7,781,800 B2 * | 8/2010 | Chen et al. | 257/190 |
| 2004/0104429 A1 * | 6/2004 | Takahashi et al. | 257/338 |
| 2004/0142579 A1 * | 7/2004 | Morita et al. | 438/785 |
| 2005/0035409 A1 | 2/2005 | Ko et al. | |
| 2005/0145956 A1 * | 7/2005 | Wang et al. | 257/410 |
| 2006/0030093 A1 | 2/2006 | Zhang et al. | |
| 2006/0046406 A1 * | 3/2006 | Chindalore et al. | 438/301 |
| 2006/0076579 A1 * | 4/2006 | Thean et al. | 257/213 |
| 2007/0190702 A1 * | 8/2007 | Yeo et al. | 438/149 |
| 2008/0185636 A1 * | 8/2008 | Luo et al. | 257/327 |
| 2008/0242032 A1 * | 10/2008 | Chakravarthi et al. | 438/285 |

FOREIGN PATENT DOCUMENTS

CN 1505170 6/2004

OTHER PUBLICATIONS

Chaudhry, Muhammad, "Electrical Transport Properties of Crystalline Silicon Carbide/Silicon Heterojunctions", IEEE Electron Device Letters, Dec. 1991, pp. 670-672, vol. 12, No. 12, IEEE.
Duncan, Amanda et al., "Full Band Monte Carlo Investigation of Hot Carrier Trends in the Scaling of Metal-Oxide-Semiconductor Field-Effect Transistors", IEEE Transactions on Electron Devices, Apr. 1998, pp. 867-876, vol. 45, No. 4, IEEE.
Kroemer, Herbert, "Heterostructure Bipolar Transistors and Integrated Circuits", Proceedings of the IEEE, Jan. 1982, pp. 13-25, vol. 70, No. 1, IEEE.
Yoshimi, Makoto et al., "Suppression of the Floating-Body Effect in SOI MOSFET's by the Bandgap Engineering Method Using a Si1-xGex Source Structure", IEEE Transactions on Electron Devices, pp. 423-430, vol. 44, No. 3, IEEE.

* cited by examiner

*Primary Examiner* — Evan Pert
*Assistant Examiner* — Eduardo A Rodela
(74) *Attorney, Agent, or Firm* — Scully, Scott, Murphy & Presser, P.C.; H. Daniel Schnurmann

(57) ABSTRACT

A field effect transistor comprising a silicon containing body is provided. After formation of a gate dielectric, gate electrode, and a first gate spacer, a drain side trench is formed and filled with a wide band gap semiconductor material. Optionally, a source side trench may be formed and filled with a silicon germanium alloy to enhance an on-current of the field effect transistor. Halo implantation and source and drain ion implantation are performed to form various doped regions. Since the wide band gap semiconductor material as a wider band gap than that of silicon, impact ionization is reduced due to the use of the wide band gap semiconductor material in the drain, and consequently, a breakdown voltage of the field effect transistor is increased compared to transistors employing silicon in the drain region.

14 Claims, 23 Drawing Sheets

FIELD EFFECT TRANSISTOR CONTAINING A WIDE BAND GAP SEMICONDUCTOR MATERIAL IN A DRAIN

FIELD OF THE INVENTION

The present invention relates to a semiconductor device, and particularly to a metal oxide semiconductor field effect transistor (MOSFET) having a high breakdown voltage and methods of manufacturing the same.

BACKGROUND OF THE INVENTION

On one hand, a metal oxide semiconductor field effect transistor (MOSFET) built on a silicon-on-insulator (SOI) substrate typically offers advantages over a MOSFET with comparable dimensions that is built on a bulk substrate by providing a higher on-current and lower parasitic capacitance between the body and other MOSFET components. On the other hand, a MOSFET built on an SOI substrate tends to have less consistency in the device operation due to "history effect," or "floating body effect," in which the potential of the body, and subsequently, the timing of the turn-on and the on-current of the SOI MOSFET are dependent on the past history of the SOI MOSFET. Furthermore, the level of leakage current also depends on the voltage of the floating body, which poses a challenge in the design of a low power SOI MOSFET.

The body of an SOI MOSFET stores charge which is dependent on the history of the device, hence becoming a "floating" body. As such, SOI MOSFETs exhibit threshold voltages which are difficult to anticipate and control, and which vary in time. The body charge storage effects result in dynamic sub-threshold voltage (sub-Vt) leakage and threshold voltage (Vt) mismatch among geometrically identical adjacent devices.

As in any MOSFET, the source, the body, and the drain of a SOI MOSFET form a parasitic bipolar transistor. Since the body of the SOI MOSFET is electrically floating, the base of the parasitic bipolar transistor is also floating. The SOI MOSFET with the floating body may have a breakdown voltage that is about 8~10 times less than the breakdown voltage of a MOSFET having otherwise identical components and having a grounded base. The floating body may have a detrimental effect on reliability of the SOI MOSFET.

Several methods have been provided in the prior art to alleviate the deleterious effect of the floating body on the breakdown voltage of the SOI MOSFET. In one approach, the body of an SOI MOSFET is electrically grounded so that the base of the parasitic bipolar transistor is also grounded. In another approach, the electric field in the drain may be reduced by employing a lightly doped drain (LDD) structure. In yet another approach, the lifetime of minority carriers are increased in the body to decrease the gain of the parasitic bipolar transistor. These techniques are in general beneficial to reduction of the floating body effect in general by either reducing the impact ionization rate or by efficiently removing a floating charge from the body.

Each of the above approaches, however, has certain drawbacks. Body contact structures for grounding the body tend to require a relatively large area. Also, the efficacy of such body contact structures depends on the size of the SOI MOSFET. Further, such devices are inherently asymmetric, and may not be used for applications that require symmetry of the device such as a pass gate transistor in a static random access memory (SRAM) cell. The lightly doped drain structure increases resistance of the drain extension region and reduces the on-current of the device. Reduction of the lifetime of the minority carriers increases leakage current in an off-state of the SOI MOSFET.

In view of the above, there exists a need to increase a breakdown voltage of an SOI MOSFET without accompanying adverse effects on device performance.

Specifically, there exists a need to increase the breakdown voltage of the SOI MOSFET without requiring an additional device area, without reducing an on-current, and without increasing an off-current.

SUMMARY OF THE INVENTION

The present invention addresses the needs described above by providing a field effect transistor containing a silicon based body and a drain region that comprises a wide band gap semiconductor material to suppress impact ionization, and methods of manufacturing the same. The wide band gap semiconductor material has a larger band gap than silicon.

In the present invention, a field effect transistor comprising a silicon containing body is provided. After formation of a gate dielectric, gate electrode, and a first gate spacer, a drain side trench is formed and filled with a wide band gap semiconductor material. Optionally, a source side trench may be formed and filled with a silicon germanium alloy to enhance an on-current of the field effect transistor. Halo implantation and source and drain ion implantation are performed to form various doped regions. Since the wide band gap semiconductor material has a greater band gap than silicon, impact ionization is reduced due to the use of the wide band gap semiconductor material in the drain, and consequently, a breakdown voltage of the field effect transistor is increased compared to transistors employing silicon in the drain region.

According to an aspect of the present invention, a field effect transistor is provided, which comprises:
    a body including a silicon containing body portion and a wide band gap semiconductor material containing body portion; and
    a drain region including a wide band gap semiconductor material containing drain portion abutting the wide band gap semiconductor material containing body portion, wherein the wide band gap semiconductor material containing body portion and the wide band gap semiconductor material containing drain portion comprises a semiconductor material having a wider band gap than silicon.

In one embodiment, the field effect transistor further comprises a gate dielectric vertically abutting the body.

In another embodiment, the drain region further contains a silicon containing drain portion abutting the gate dielectric.

In even another embodiment, the wide band gap semiconductor material containing body portion abuts the gate dielectric.

In yet anther embodiment, the body further includes a drain side halo region that abuts the wide band gap semiconductor material containing body portion and the gate dielectric.

In still another embodiment, the field effect transistor further comprises a source region including a silicon-germanium alloy containing source portion and abutting the body.

In still yet another embodiment, the body region further comprises a silicon-germanium alloy containing body portion.

In a further embodiment, the source region further comprises a silicon containing source portion abutting the gate dielectric.

In an even further embodiment, the body further includes a source side halo region that abuts the silicon-germanium alloy containing source portion.

In a yet further embodiment, the field effect transistor further comprises:
 a buried insulator layer vertically abutting the body; and
 a handle substrate vertically abutting the buried insulator layer.

In a still further embodiment, the body has a p-type doping and the drain region has an n-type doping.

In a still yet further embodiment, the wide band gap semiconductor material containing body portion and the wide band gap semiconductor material containing drain portion comprise stoichiometric silicon carbide in which an atomic ratio between silicon and carbon is substantially 1.

In further another embodiment, the wide band gap semiconductor material containing body portion and the wide band gap semiconductor material containing drain portion comprise one of gallium nitride, aluminum nitride, boron nitride, and diamond.

According to another aspect of the present invention, a method of forming a field effect transistor is provided, which comprises:
 providing a substrate having a semiconductor region;
 forming a gate dielectric, a gate electrode, and a gate spacer on the semiconductor region;
 forming a trench directly adjoining one side of the first gate spacer in a portion of the semiconductor region;
 forming a wide band gap semiconductor material region containing a semiconductor material having a wider band gap than silicon by filling the trench; and
 implanting dopants into a portion of the wide band gap semiconductor material region to form a wide band gap semiconductor material containing drain portion.

In one embodiment, the method further comprises:
 forming source and drain extension regions on a top surface of the semiconductor region; and
 forming another gate spacer on the gate electrode prior to the doping of the portion of the wide band gap semiconductor material.

In another embodiment, the other portion of the wide band gap semiconductor material region is not implanted with the dopants, wherein the other portion is a part of a body of the field effect transistor.

In even another embodiment, the method further comprises masking another portion of the semiconductor region directly adjoining another side of the first gate spacer, wherein the another portion is not etched during the forming of the trench.

In yet another embodiment, the method further comprises:
 forming another trench in the another portion of the semiconductor region; and
 forming a silicon germanium alloy region by filling the another trench.

In still another embodiment, the method further comprises masking the wide band gap semiconductor material region, wherein the wide band gap semiconductor material region is not etched during the etching of the another trench.

In still yet another embodiment, the method further comprises forming a source side halo region, wherein the source side halo region abuts the gate dielectric and the silicon germanium alloy region.

In a further embodiment, the method further comprises forming a drain side halo region, wherein the drain side halo region abuts the gate dielectric and the wide band gap semiconductor material region.

BRIEF DESCRIPTION OF THE DRAWINGS

FIGS. 18-19 are sequential vertical cross-sectional view of a second exemplary semiconductor structure according to a second embodiment of the present invention.

DETAILED DESCRIPTION OF THE INVENTION

Figure 1:
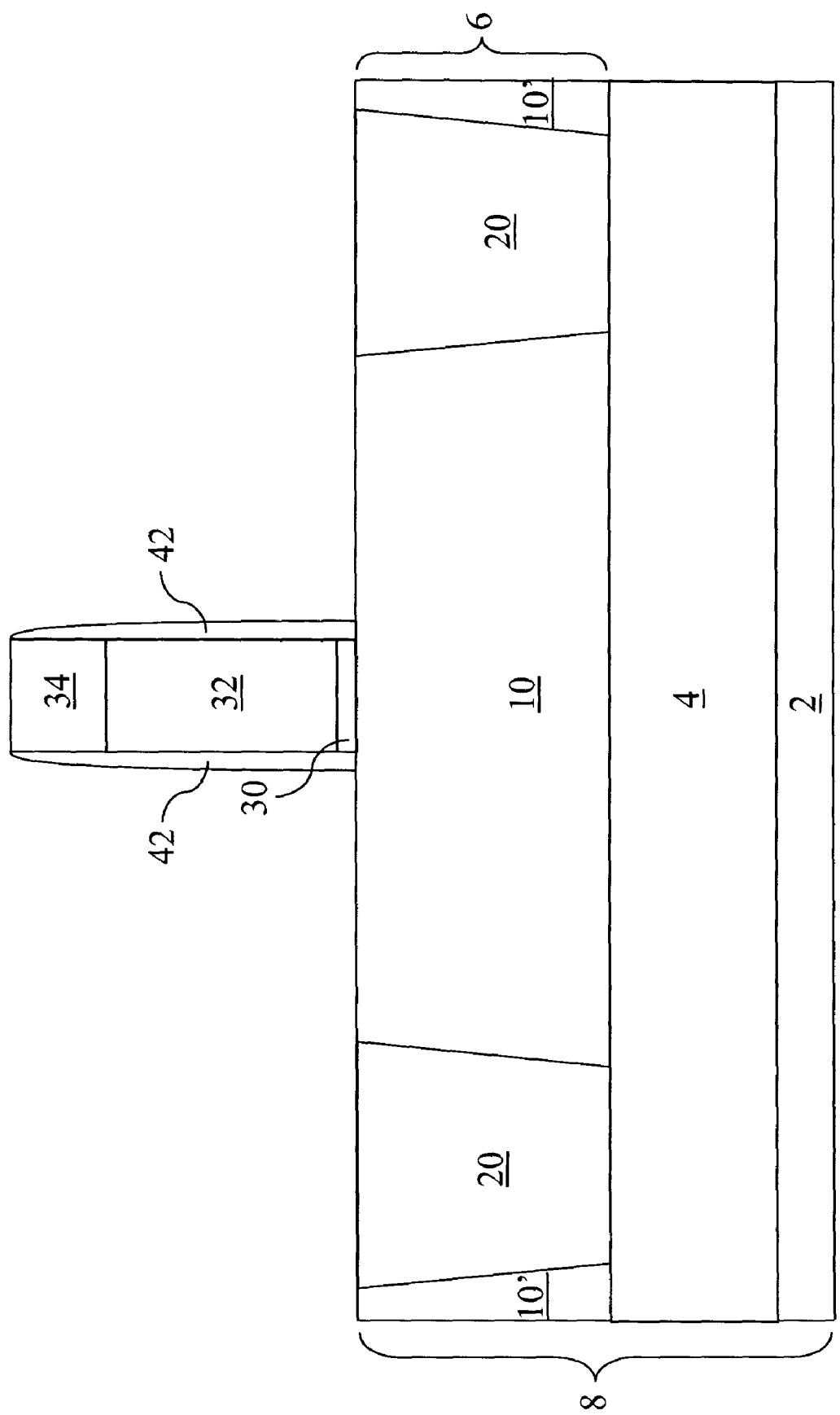
FIGS. 1-16 are sequential vertical cross-sectional views of a first exemplary semiconductor structure at various stages of a manufacturing process according to a first embodiment of the present invention.

As stated above, the present invention relates to a metal oxide semiconductor field effect transistor (MOSFET) having a high breakdown voltage and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to the present invention comprises a substrate 8 and a gate structure formed thereupon. The substrate 8 includes a semiconductor region 10 that comprises silicon. The substrate 8 may be a semiconductor-on-insulator (SOI) substrate comprising a handle substrate 2, a buried insulator layer, and a top semiconductor layer 6. The top semiconductor structure contains the semiconductor region 10, a shallow trench isolation structure 20 laterally enclosing the semiconductor region 10, and at least another semiconductor region 10'. The semiconductor region 10 may have a doping of a first conductivity type, which may be p-type or n-type. In an exemplary case, the semiconductor region 10 has a p-type doping. The thickness of the top semiconductor layer 6 may be from about 15 nm to about 200 nm, and preferably from about 30 nm to about 100 nm, although lesser and greater thicknesses are herein explicitly contemplated also.

The gate structure comprises a gate dielectric 30, a gate electrode 32, a dielectric gate cap 34, and a first spacer 42 formed directly on sidewalls of the stack of the gate dielectric 30, the gate electrode 32, and the dielectric gate cap 34. The gate dielectric 30 may comprise a silicon oxide based dielectric material such as thermal silicon oxide or silicon oxynitride. Alternately, the gate dielectric 30 may comprise a high-k gate dielectric material such as $HfO_2$, $ZrO_2$, $Al_2O_3$, $TiO_2$, $La_2O_3$, $SrTiO_3$, $LaAlO_3$, $Y_2O_3$, silicates thereof, and mixtures thereof.

Figure 2:
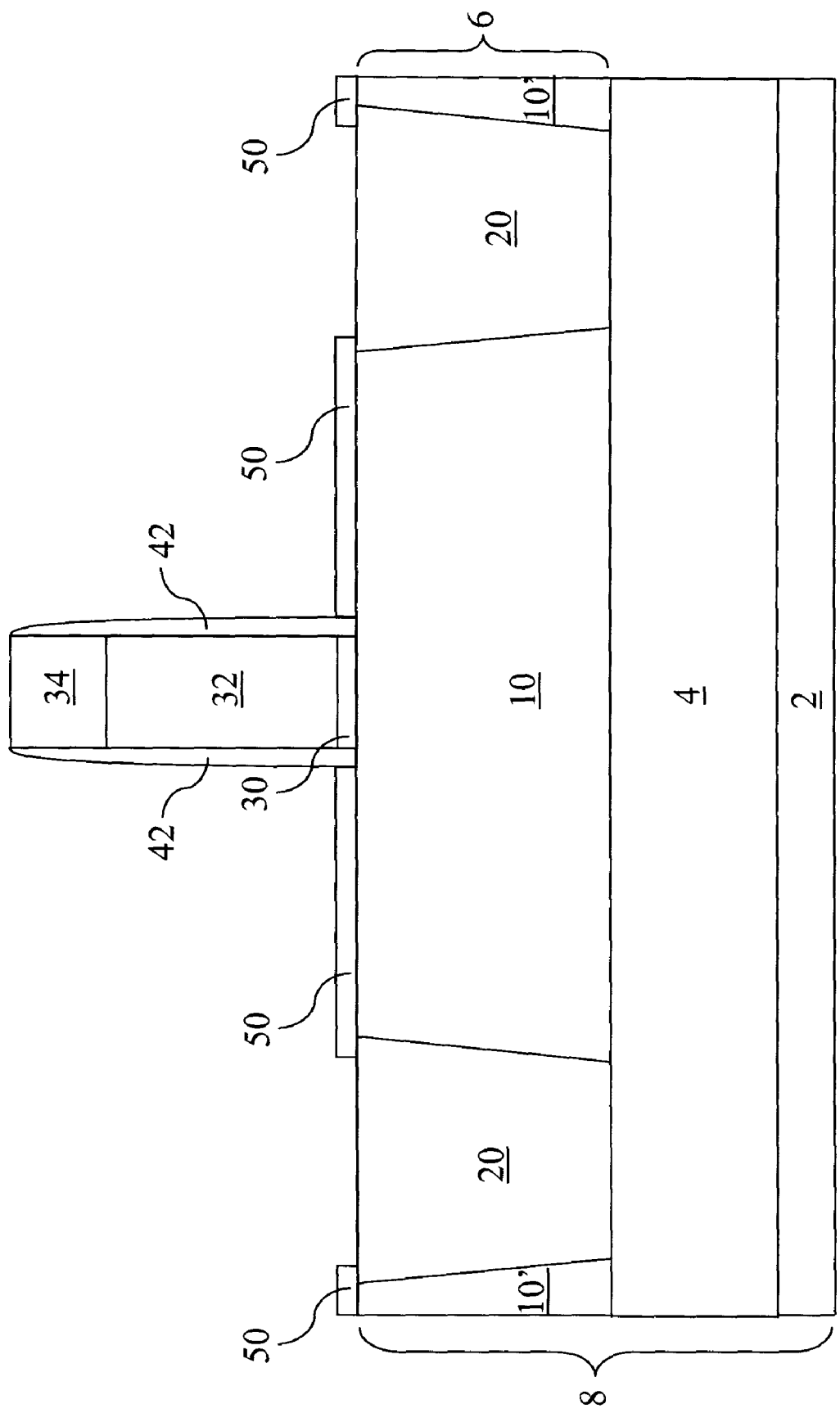

Referring to FIG. 2, a first dielectric layer 50 is formed on a top surface of the semiconductor region 10 and the at least another semiconductor region 10'. The first dielectric layer 50 comprises a dielectric material such as a metal oxide, a metal nitride, a semiconductor oxide, or a semiconductor nitride. The first dielectric layer 50 may be formed by thermal conversion of exposed surfaces of the semiconductor region 10 and the at least another semiconductor region 10'. In this case, the first dielectric layer 50 may comprise a plurality of disjoined portions. For example, the first dielectric layer 50 may comprise thermal silicon oxide or thermal silicon nitride. Alternately, the first dielectric layer 50 may be formed by chemical vapor deposition (CVD) such as low pressure chemical vapor deposition (LPCVD), plasma enhanced chemical vapor deposition (PECVD), or rapid thermal chemical vapor deposition (RTCVD). In this case, the first dielectric layer 50 is a contiguous layer formed over the exposed surfaces of the semiconductor region 10 and the at least another semiconductor region 10' and over the gate structure (30, 32, 34, 42). The thickness of the first dielectric layer 50 may be from about 3 nm to about 50 nm, and preferably from about 10 nm to about 50 nm, although lesser and greater thicknesses are herein explicitly contemplated also.

Figure 3:
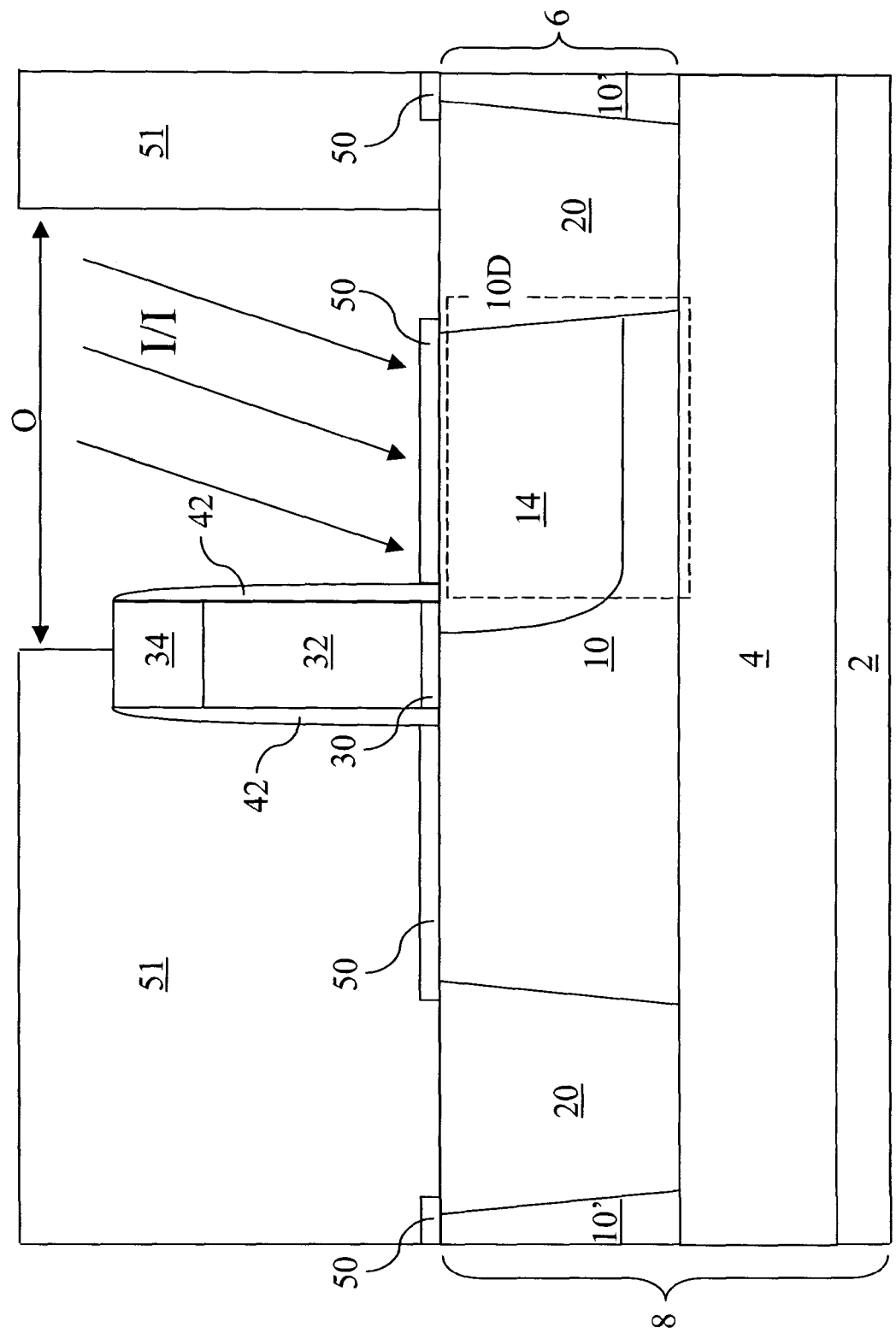

Referring to FIG. 3, a first photoresist 51 is applied over the semiconductor region 10 and lithographically patterned to form an opening O in the first photoresist 51 over a drain side portion 10D of the semiconductor layer 10 that directly adjoins one side of the first gate spacer 42. Dopants of the first conductivity type are implanted into the drain side portion 10D of the semiconductor region 10 in an ion implantation step to form a drain side halo region 14. The drain side halo region 14 has a higher concentration of dopants than the semiconductor region 10. Preferably, the ion implantation is performed at an angle so that the drain side halo region 14 laterally extends from an outer edge of the first spacer 42 and abuts the gate dielectric 30. The arrows labeled I/I show an exemplary direction for the dopants during the ion implantation. The dopant concentration of the drain side halo region 14 may be from about $3.0 \times 10^{17}/cm^3$ to about $1.0 \times 10^{20}/cm^3$, and preferably from about $1.0 \times 10^{18}/cm^3$ to about $3.0 \times 10^{19}/cm^3$.

Figure 4:
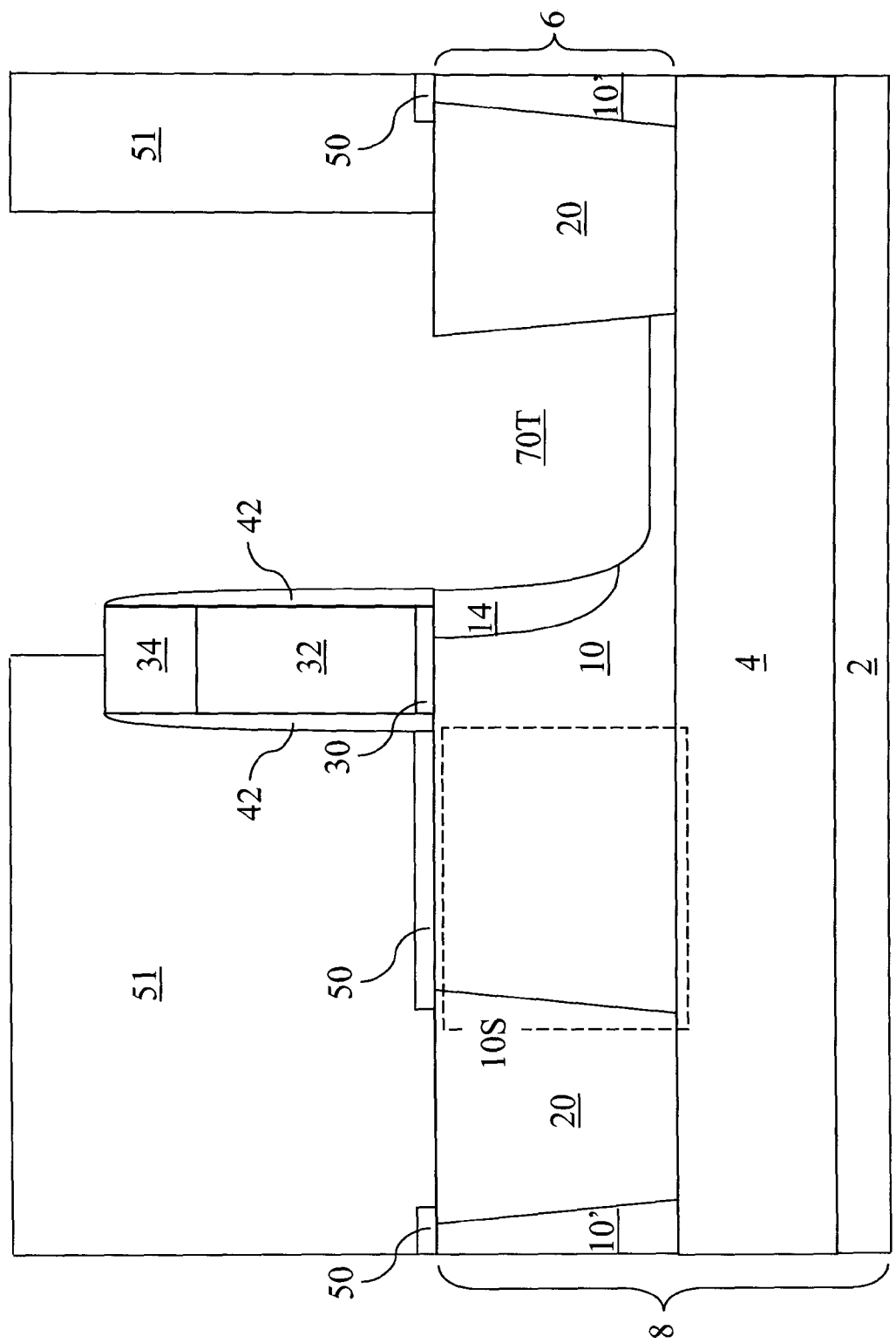

Referring to FIG. 4, a drain side trench 70T is formed in a portion of the drain side halo region 14. A reactive ion etch may be employed silicon in the drain side portion 10D (See FIG. 3) of the semiconductor region 10. The depth of the drain side trench 70T may be greater than the depth of the drain side halo region 14. In this case, the drain side trench 70T extends into the semiconductor region 10. Preferably, the bottom surface of the drain side trench 70T is located above a top surface of the buried insulator layer 4 so that the bottom surface of the drain side trench 70T comprises silicon. A sidewall of the drain side trench 70T may substantially coincide with the outer edge of the first spacer 42. The drain side halo region 14, having a reduced size after the formation of the drain side trench 70T, vertically abuts the gate dielectric 30, a bottom surface of one side of the first gate spacer 42, and the sidewall of the drain side trench 70T. A source side portion 10S of the semiconductor region 10, which is located on an opposite side of the drain side trench 70T across the gate dielectric 30, is protected during the reactive ion etch by the first photoresist 51.

Figure 5:
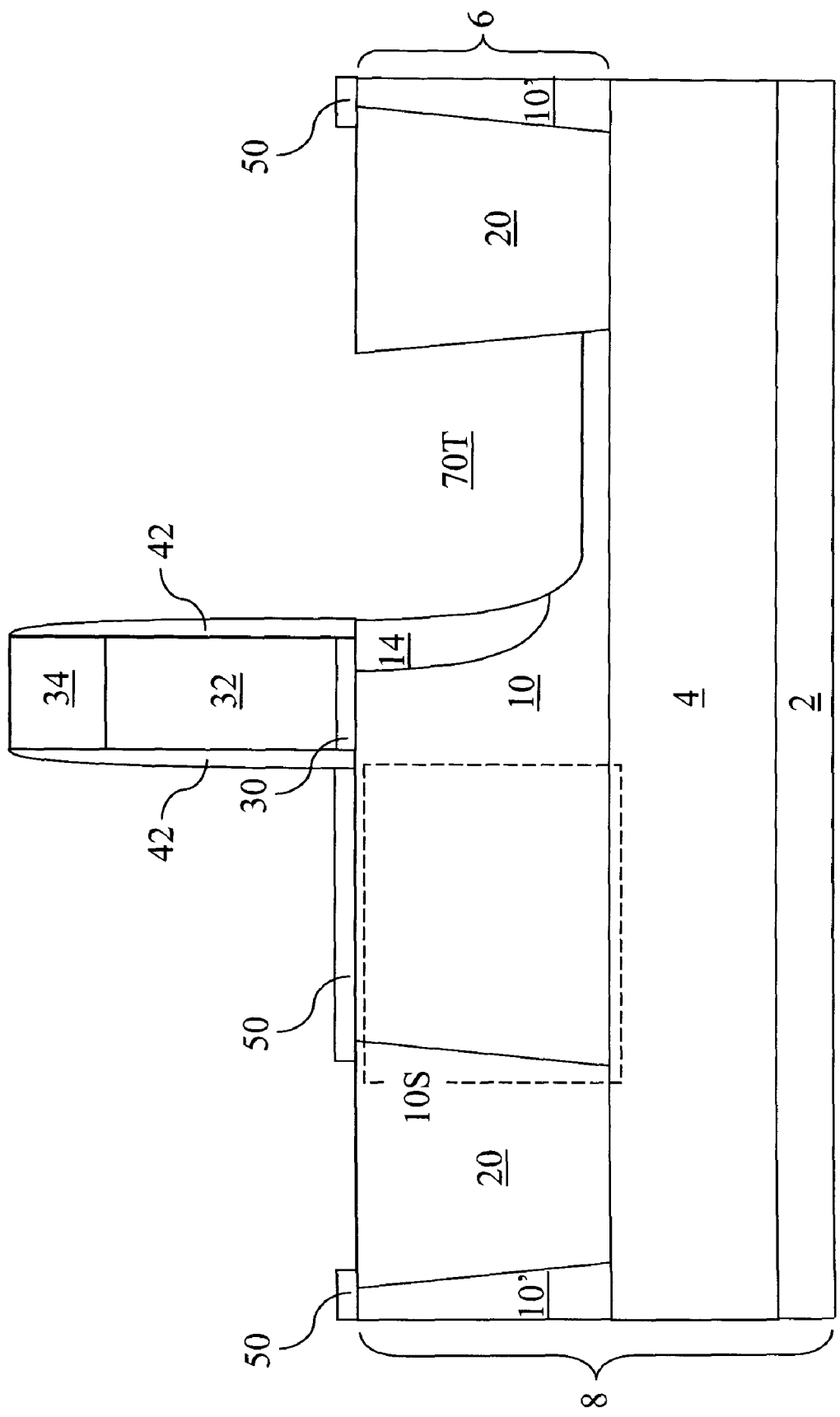

Referring to FIG. 5, the first photoresist 51 is removed, for example, by ashing. Silicon is exposed on the bottom surface and the sidewall of the drain side trench 70T in the drain side portion 10D. The first dielectric layer 50 is located on the source side portion 10S of the semiconductor region 10 so that a silicon surface of the source side portion 10S is not exposed. The bottom surface and the sidewall of the drain side trench 70T, which comprise silicon, are exposed at this point.

Figure 6:
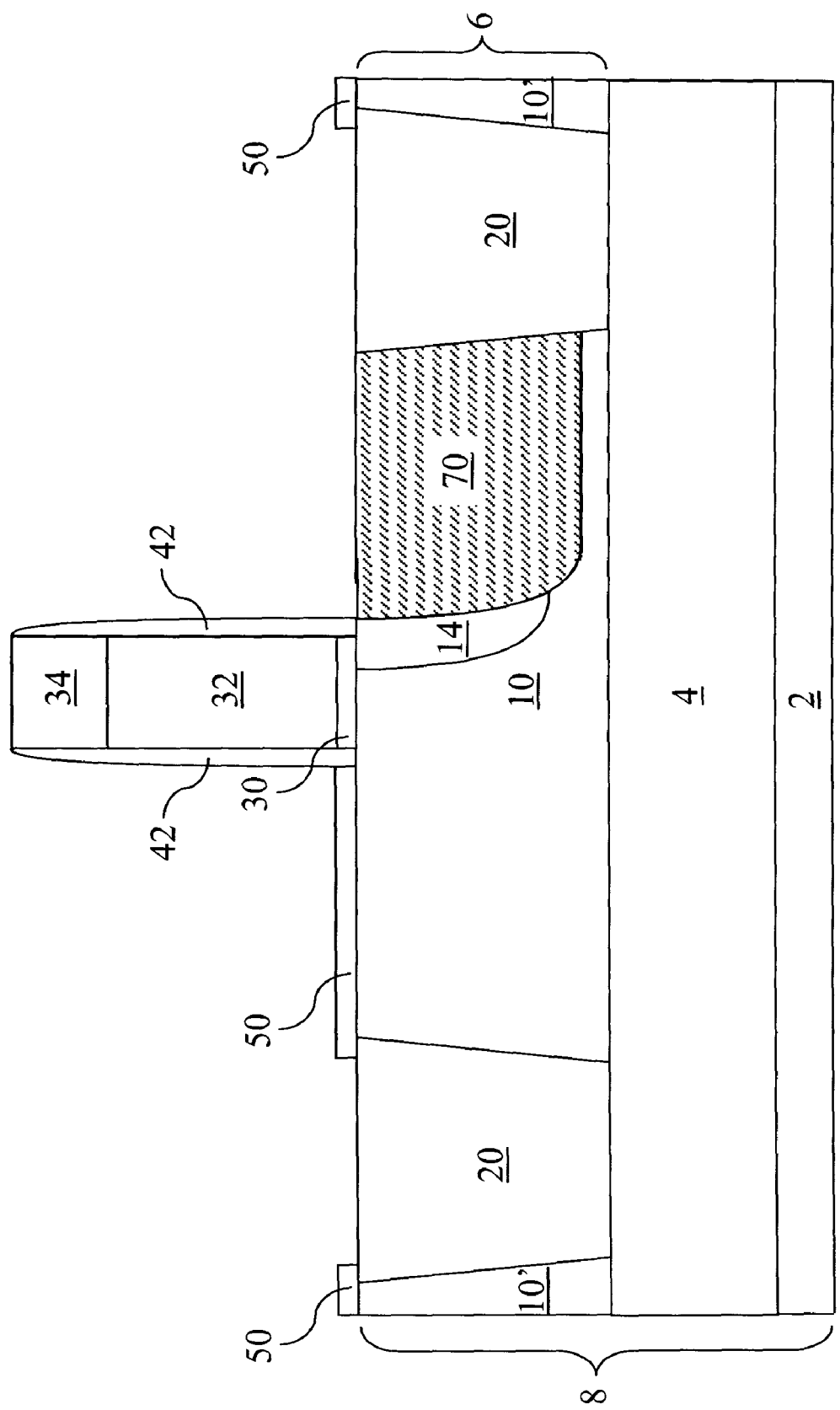

Referring to FIG. 6, a wide band gap semiconductor material is deposited on exposed semiconductor surfaces including the bottom surface and the sidewall of the drain side trench 70T. The wide band gap semiconductor material herein denotes a semiconductor material having a larger band gap than the material in the body region, which is silicon. Exemplary materials for the wide band gap semiconductor material include silicon carbide, gallium nitride, aluminum nitride, boron nitride, diamond, etc.

In case the wide band gap semiconductor material comprises silicon carbide, chemical vapor deposition may be employed for deposition of silicon carbide. Methods of forming a silicon carbide layer are known in the art. Various precursors are available for chemical vapor deposition of silicon carbide. For example, a combination of tetrachlorosilane ($SiCl_4$) and propane ($C_3H_8$) may be employed as precursor gases with a hydrogen ($H_2$) carrier gas. Alternately, polymethysilane may be employed as a precursor gas with a hydrogen ($H_2$) carrier gas. Yet alternately, methyltrichlorosilane ($CH_3SiCl_4$) may be employed as a precursor with a hydrogen ($H_2$) carrier gas. Still alternately, another precursor such as polysilenemethylenes (PSM), which contains a structure of $[-SiH_2-CH_2-]_n$, in which n is from 2 to 8, and includes branched and cyclic isomers, may be employed with a carrier gas such as argon, nitrogen, and/or helium. Deposition temperature from about 550° C. to about 1,000° C. may be employed. Low pressure chemical vapor deposition or rapid thermal chemical vapor deposition may be employed. Plasma enhanced chemical vapor deposition below 550° C. has also been demonstrated in the art.

Preferably, the growth of silicon carbide is selective so that silicon carbide is deposited on semiconductor surfaces such as the silicon surface of the bottom surface and the sidewall of the drain side trench 70T, but is not deposited on dielectric surfaces such as the surface of the first dielectric layer 50. Selective deposition of silicon carbide may be effected by addition of an etchant into a reaction chamber concurrently with introduction of a precursor for SiC deposition. For example, a chlorine containing gas such as HCl, $BCl_3$, $Cl_2$, or a combination thereof may be employed as the etchant to enable selective deposition of silicon carbide. Alternately, a fluorine containing gas such as $NF_3$ may be employed as the etchant to enable selective deposition of silicon carbide.

In case the wide band gap semiconductor material comprises another semiconductor material having a band gap greater than the band gap of silicon, methods known in the art for depositing such a wide band gap semiconductor material may be employed, which typically include various types of chemical vapor deposition.

A wide band gap semiconductor material region 70 is formed in the drain side trench 70T. The wide band gap semiconductor material region 70 laterally abuts a portion of the shallow trench isolation structure 20. A top surface of the wide band gap semiconductor material region 70 may be substantially coplanar with, located above, or located below a top surface of the shallow trench isolation structure 20. The wide band gap semiconductor material region 70 may be deposited as an amorphous material, a microcrystalline material, a polycrystalline material, or an epitaxial material depending on the thickness of the drain side trench 70T. In case the wide band gap semiconductor material comprises silicon carbide, due to a relatively high lattice mismatch between silicon and silicon carbide as well as differences in the crystal structure, deposition of silicon carbide is known to be prone to generation of polycrystalline or amorphous structures instead of an epitaxial material in thicker layers.

In one case, the wide band gap semiconductor material region 70 comprises a stoichiometric silicon carbide in which an atomic ratio between silicon and carbon is substantially 1.

Silicon carbide is known to exist in at least 70 crystalline forms including alpha silicon carbide (α-SiC) having a hexagonal crystal structure and beta silicon carbide (β-SiC) having a face-centered cubic crystal structure. Silicon carbide has a wide band gap from about 2.2 eV and 3.3 eV. Electrical properties of the band gap of silicon carbide are described in U.S. Pat. No. 5,319,220 to Suzuki et al., the entire contents of which are herein incorporated by reference.

In another case, the wide band gap semiconductor material region comprises one of gallium nitride, aluminum nitride, boron nitride, and diamond.

In the present invention, the wide band gap of the wide band gap semiconductor material suppresses impact ionization in a drain region as will be shown below. The wide band gap semiconductor material region 70 may be substantially undoped or doped with dopants of the first conductivity type at a dopant concentration from about $1.0 \times 10^{15}/cm^3$ to about $3.0 \times 10^{19}/cm^3$, and preferably from about $1.0 \times 10^{15}/cm^3$ to about $3.0 \times 10^{18}/cm^3$.

Figure 7:
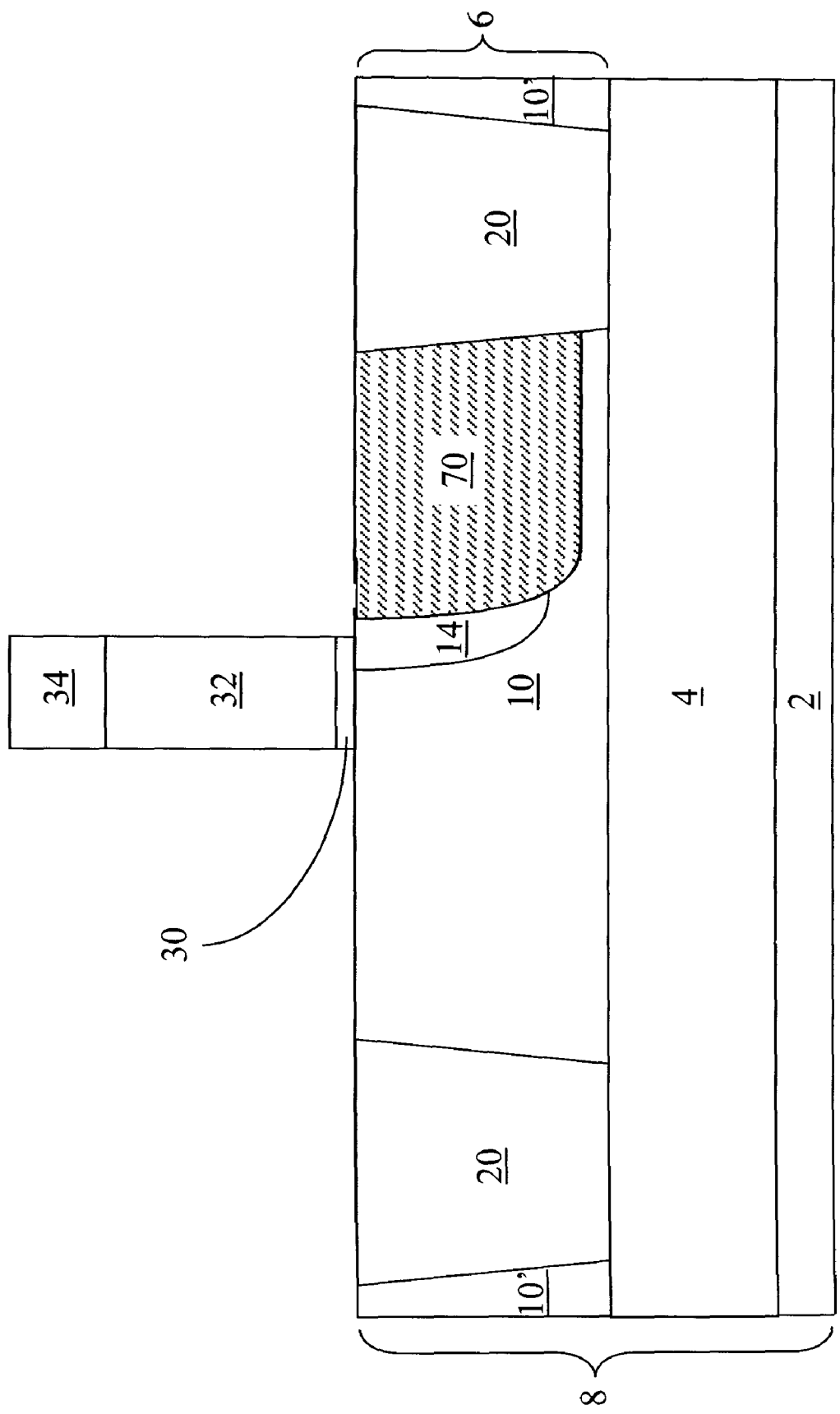

Referring to FIG. 7, the first gate spacer 42 and the first dielectric layer 50 are removed by an etch. The etch may be an isotropic etch such as a wet etch. For example, in case the first dielectric layer 50 and/or the first spacer 42 comprise silicon oxide, hydrofluoric acid (HF) may be employed. In case the first dielectric layer 50 and/or the first spacer 42 comprise silicon nitride, hot phosphoric acid may be employed. Suitable etch chemistry may be employed for other dielectric materials as well. Sidewalls of the gate dielectric 30, the gate electrode 32, and the dielectric gate cap 34 are exposed after removal of the first gate spacer 42.

Figure 8:
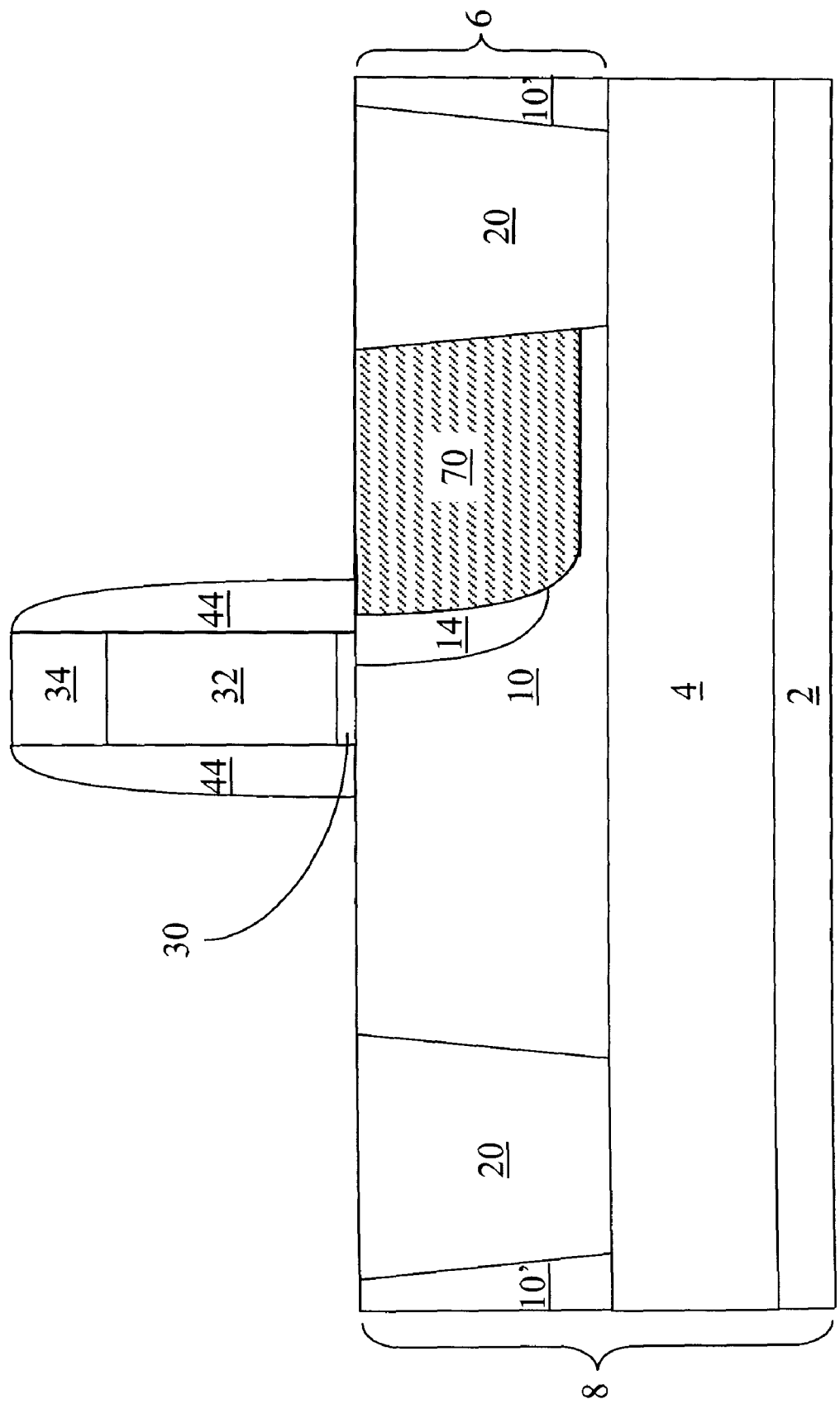

Referring to FIG. 8, a second gate spacer 44 is formed on the sidewalls of the gate dielectric 30, the gate electrode 32, and the dielectric gate cap 34 by a conformal deposition of a dielectric layer and an anisotropic etch. The second gate spacer 44 may comprise silicon oxide, silicon nitride, a dielectric metal oxide, or a dielectric metal nitride.

Figure 9:
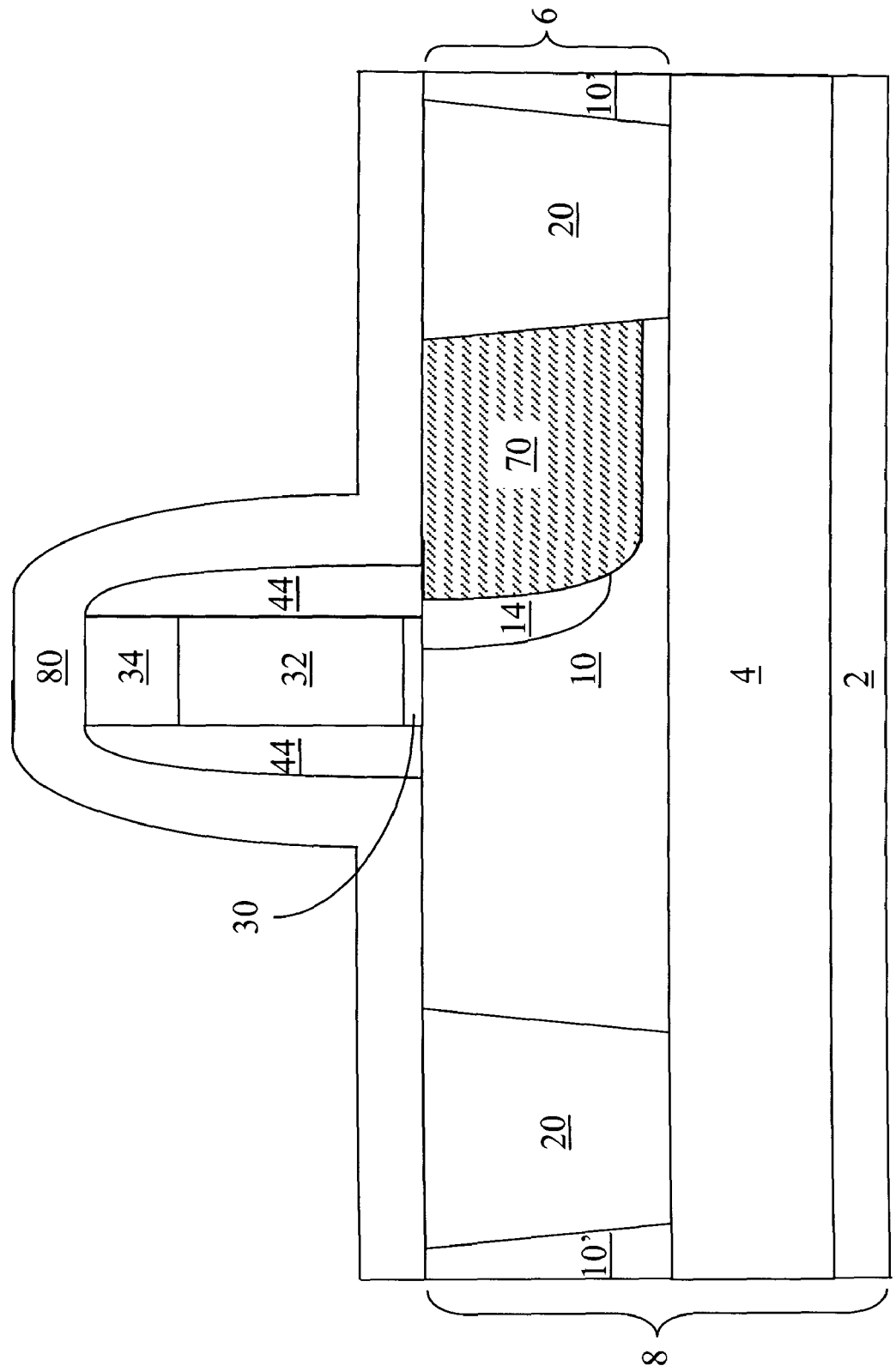

Referring to FIG. 9, a second dielectric layer 80 is formed on the semiconductor region 10 and the at least another semiconductor region 10'. The second dielectric layer 80 comprises a dielectric material such as a metal oxide, a metal nitride, a semiconductor oxide, or a semiconductor nitride. The second dielectric layer 80 may be formed by chemical vapor deposition (CVD) such as low pressure chemical vapor deposition (LPCVD), plasma enhanced chemical vapor deposition (PECVD), or rapid thermal chemical vapor deposition (RTCVD). The second dielectric layer 80 is a contiguous layer formed over the semiconductor region 10, the at least another semiconductor region 10', the shallow trench isolation structure 20, the second gate spacer 44, and the dielectric gate cap 34. The thickness of the second dielectric layer 80 may be from about 5 nm to about 50 nm, and preferably from about 10 nm to about 50 nm, although lesser and greater thicknesses are explicitly contemplated herein also.

Figure 10:
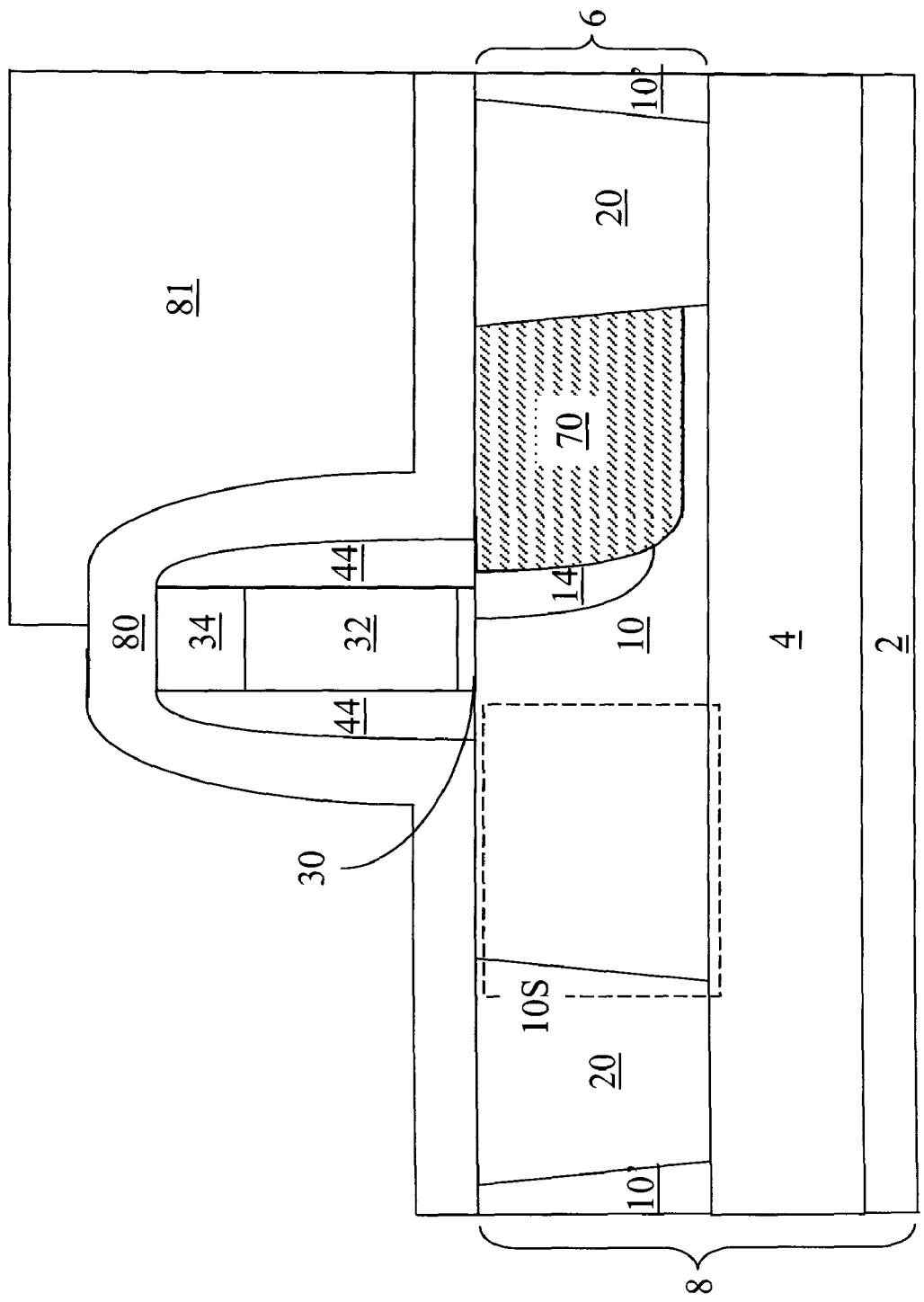

Referring to FIG. 10, a second photoresist 81 is applied over the semiconductor region 10 and the wide band gap semiconductor material region 70 and lithographically patterned to expose a portion of the second dielectric layer 80 located directly on the semiconductor region 10, while covering another portion of the second dielectric layer located directly on the wide band gap semiconductor material region 70.

Figure 11:
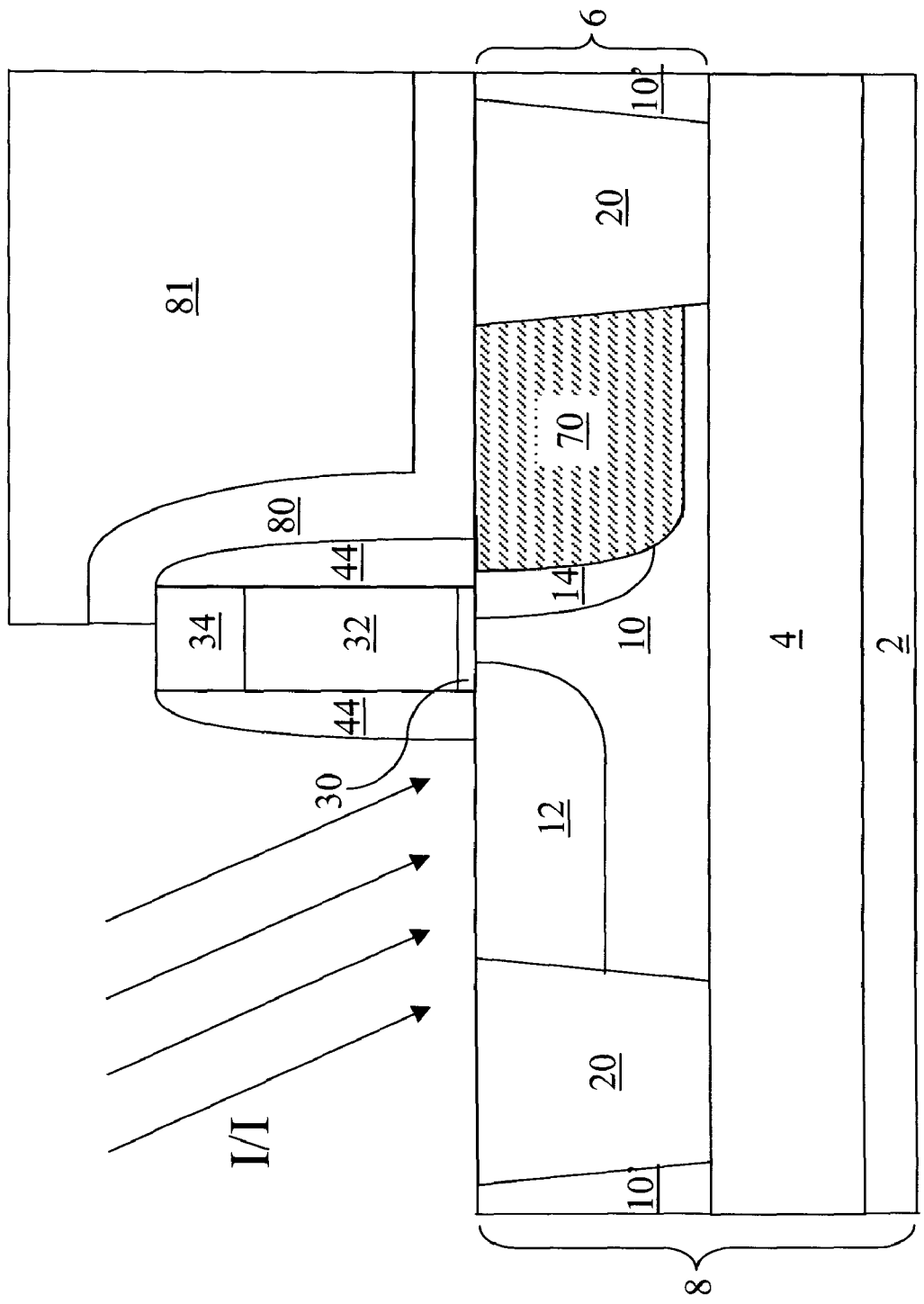

Referring to FIG. 11, the exposed portion of the second dielectric layer 80 is removed by an etch. The etch may be an anisotropic etch such as a reactive ion etch or an isotropic etch such as a wet etch. Preferably, the etch is selective to the semiconductor region 10, which comprises silicon. A top surface of the semiconductor region 10 is exposed between an outer sidewall of the second spacer 42 and a portion of the shallow trench isolation structure 20 on an opposite side of the wide band gap semiconductor material region 70 across the stack of the gate dielectric 30, the gate electrode 32, and the dielectric gate cap 34.

Dopants of the first conductivity type are implanted into the source side portion 10S (See FIG. 10) of the semiconductor region 10 in another ion implantation step to form a source side halo region 12. The source side halo region 12 has a higher concentration of dopants than the semiconductor region 10. Preferably, the ion implantation is performed at an angle so that the source side halo region 12 laterally extends from an outer edge of the second spacer 44 and abuts the gate dielectric 30. The arrows labeled I/I show an exemplary direction for the direction of the dopants during the ion implantation. The dopant concentration of the source side halo region 12 may be from about $3.0 \times 10^{17}/cm^3$ to about $1.0 \times 10^{20}/cm^3$, and preferably from about $1.0 \times 10^{18}/cm^3$ to about $3.0 \times 10^{19}/cm^3$.

Figure 12:
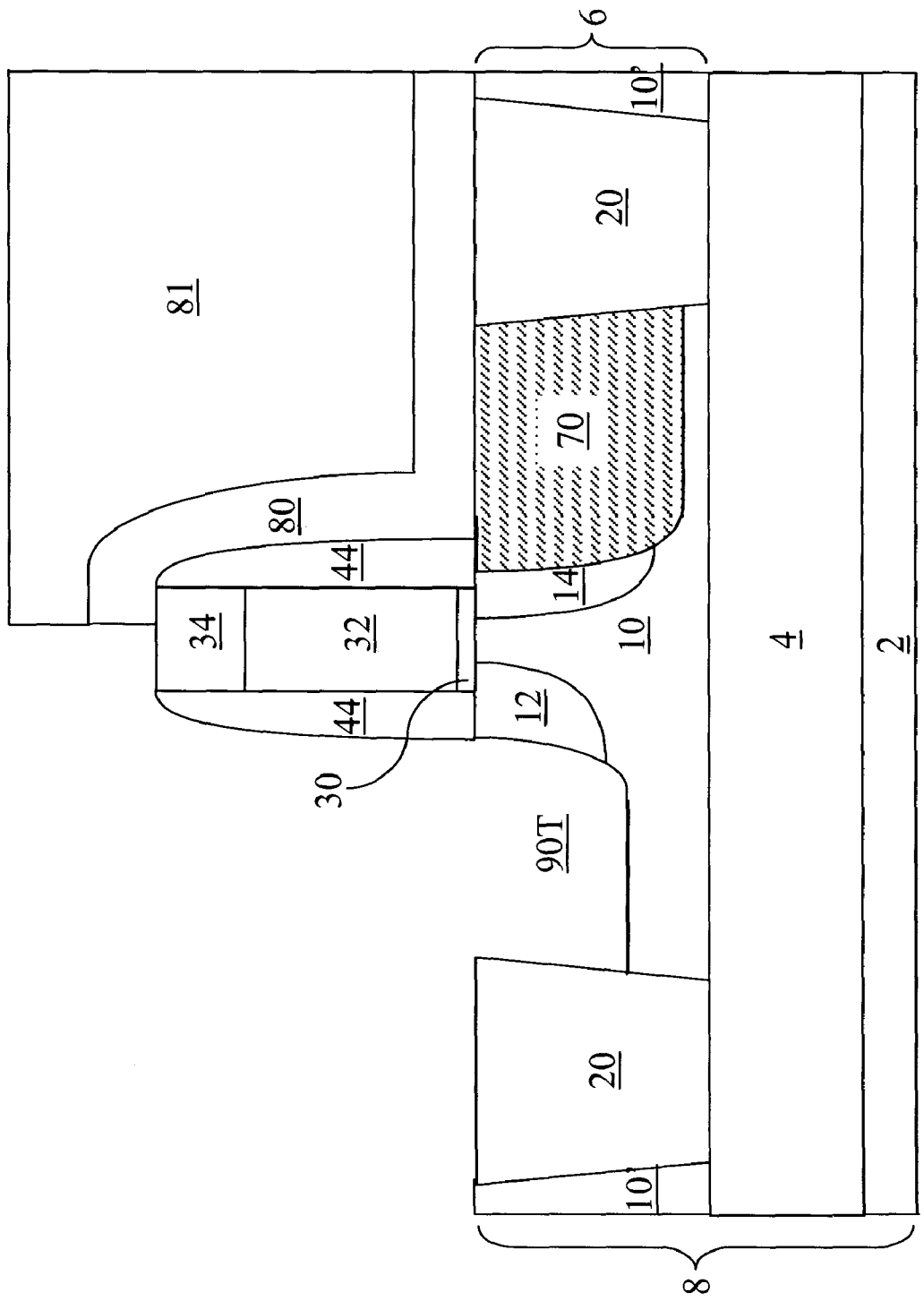

Referring to FIG. 12, a source side trench 90T is formed in a portion of the source side halo region 12. A reactive ion etch may be employed silicon in the drain side portion 10S (See FIG. 11) of the semiconductor region 10. The depth of the source side trench 90T may be greater than the depth of the source side halo region 12. In this case, the source side trench 90T extends into the semiconductor region 10. Preferably, the bottom surface of the source side trench 90T is located above a top surface of the buried insulator layer 4 so that the bottom surface of the source side trench 90T comprises silicon. A sidewall of the source side trench 90T may substantially coincide with the outer edge of the second spacer 44. The source side halo region 12, having a reduced size after the formation of the source side trench 90T, vertically abuts the gate dielectric 30, a bottom surface of one side of the second gate spacer 44, and the sidewall of the source side trench 90T. The wide band gap semiconductor material region 70, which is located on an opposite side of the source side trench 70T across the gate dielectric 30, is protected during the reactive ion etch by the second photoresist 81.

Figure 13:
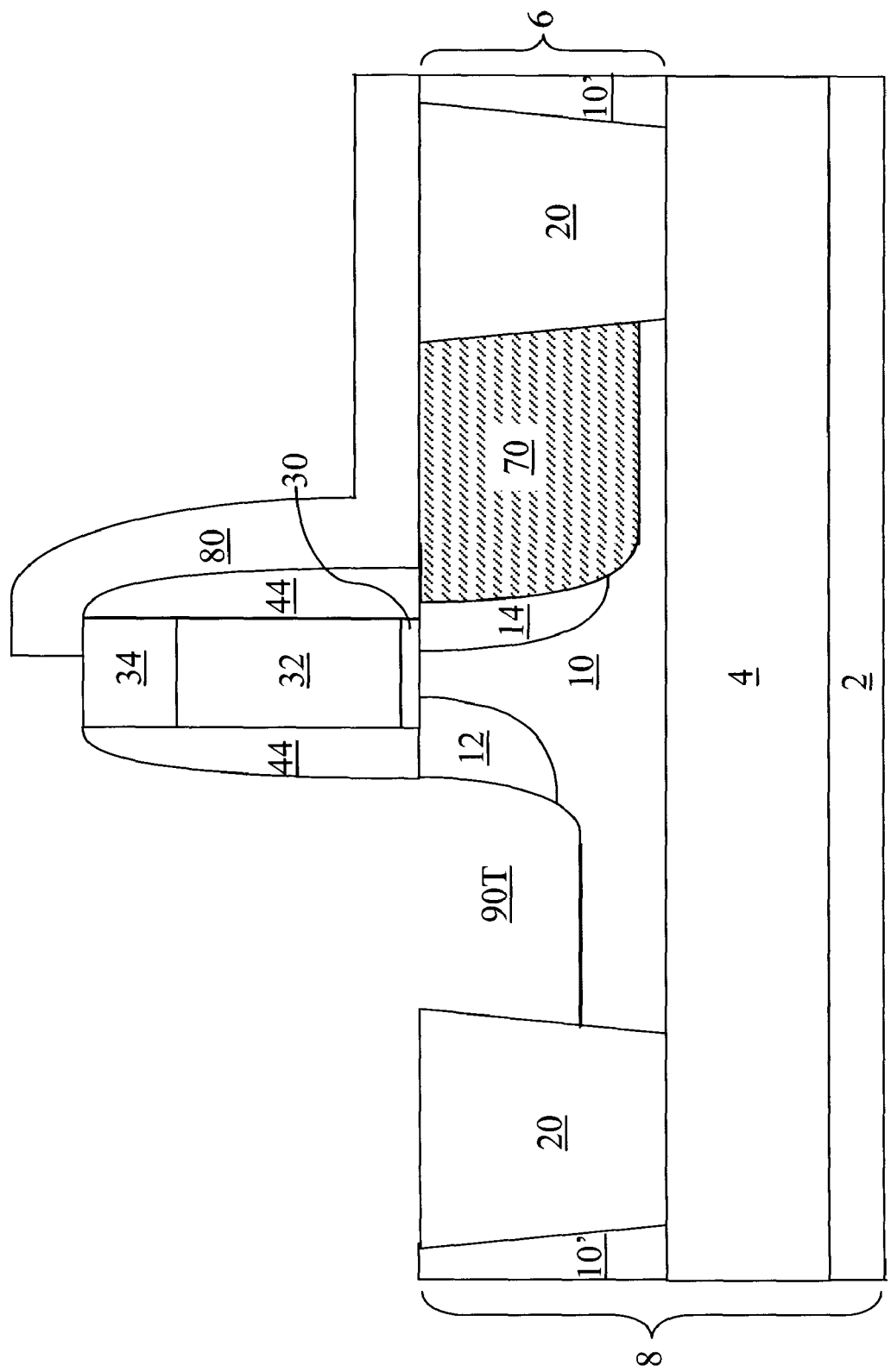

Referring to FIG. 13, the second photoresist 81 is removed, for example, by ashing. A suitable surface clean may be performed at this point on the bottom surface and the sidewall of the source side trench 90T.

Figure 14:
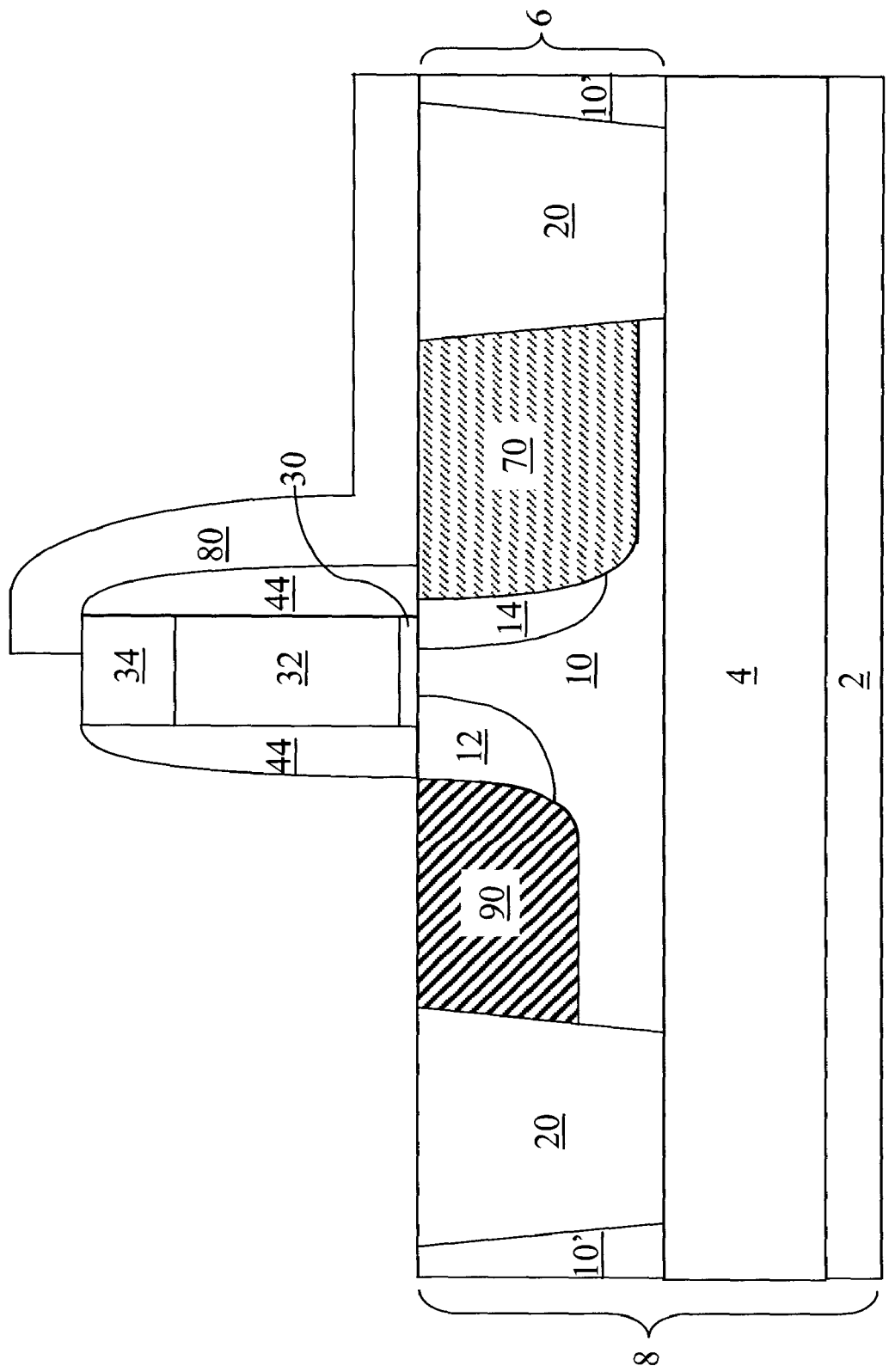

Referring to FIG. 14, a silicon germanium alloy is deposited on exposed semiconductor surfaces including the bottom surface and the sidewall of the source side trench 90T. Chemical vapor deposition may be employed for deposition of the silicon germanium alloy.

Methods of forming a silicon germanium alloy are known in the art. Various precursors are available for chemical vapor deposition of the silicon germanium alloy. A combination of a silicon containing precursor and a germanium containing precursor may be employed with a carrier gas. The silicon containing precursor may be silane, disilane, dichlorosilane, trichlorosilane, tetrachlorosilicane, an organic silicon containing precursor, or a combination thereof. The germanium containing precursor may be germane, digermane, dichlorogermane, trichlorogermane, tetrachlorogermane, an organic germanium containing precursor, or a combination thereof. The carrier gas may be hydrogran, helium, argon, or nitrogen. Deposition temperature may be from about 500° C. to about 1,000° C., although lesser and greater temperatures are explicitly contemplated herein also. Low pressure chemical vapor deposition (LPCVD), ultra high vacuum chemical vapor deposition (UHVCVD), molecular beam deposition, or rapid thermal chemical vapor deposition (RTCVD) may be employed. Plasma enhanced chemical vapor deposition below 500° C. may also be employed.

Preferably, the growth of the silicon germanium alloy is selective so that silicon germanium alloy is deposited on semiconductor surfaces such as the silicon surface of the bottom surface and the sidewall of the source side trench 90T, but is not deposited on dielectric surfaces such as the surfaces of the second dielectric layer 50, the shallow trench isolation structure 20, the second gate spacer 44, and the dielectric gate cap 34. Selective deposition of the silicon germanium alloy may be effected by addition of an etchant into a reaction chamber concurrently with introduction of the precursors for deposition of the silicon germanium alloy. For example, a chlorine containing gas such as HCl, BCl$_3$, Cl$_2$, or a combination thereof may be employed as the etchant to enable selective deposition of the silicon germanium alloy.

A silicon germanium alloy region 90 is formed in the source side trench 90T. The silicon germanium alloy region 70 laterally abuts a portion of the shallow trench isolation structure 20. A top surface of the silicon germanium alloy region 90 may be substantially coplanar with, located above, or located below a top surface of the shallow trench isolation structure 20. Preferably, the silicon germanium alloy region 90 is deposited in epitaxial alignment with the semiconductor region 10 and the source side halo region 12. The silicon germanium alloy layer 90 may comprise from 1% to about 20% of germanium in atomic concentration.

The silicon germanium alloy region 90 may be substantially undoped or doped with dopants of the first conductivity type at a dopant concentration from about $1.0\times10^{15}/cm^3$ to about $3.0\times10^{19}/cm^3$, and preferably from about $3.0\times10^{18}/cm^3$ to about $3.0\times10^{18}/cm^3$.

Figure 15:
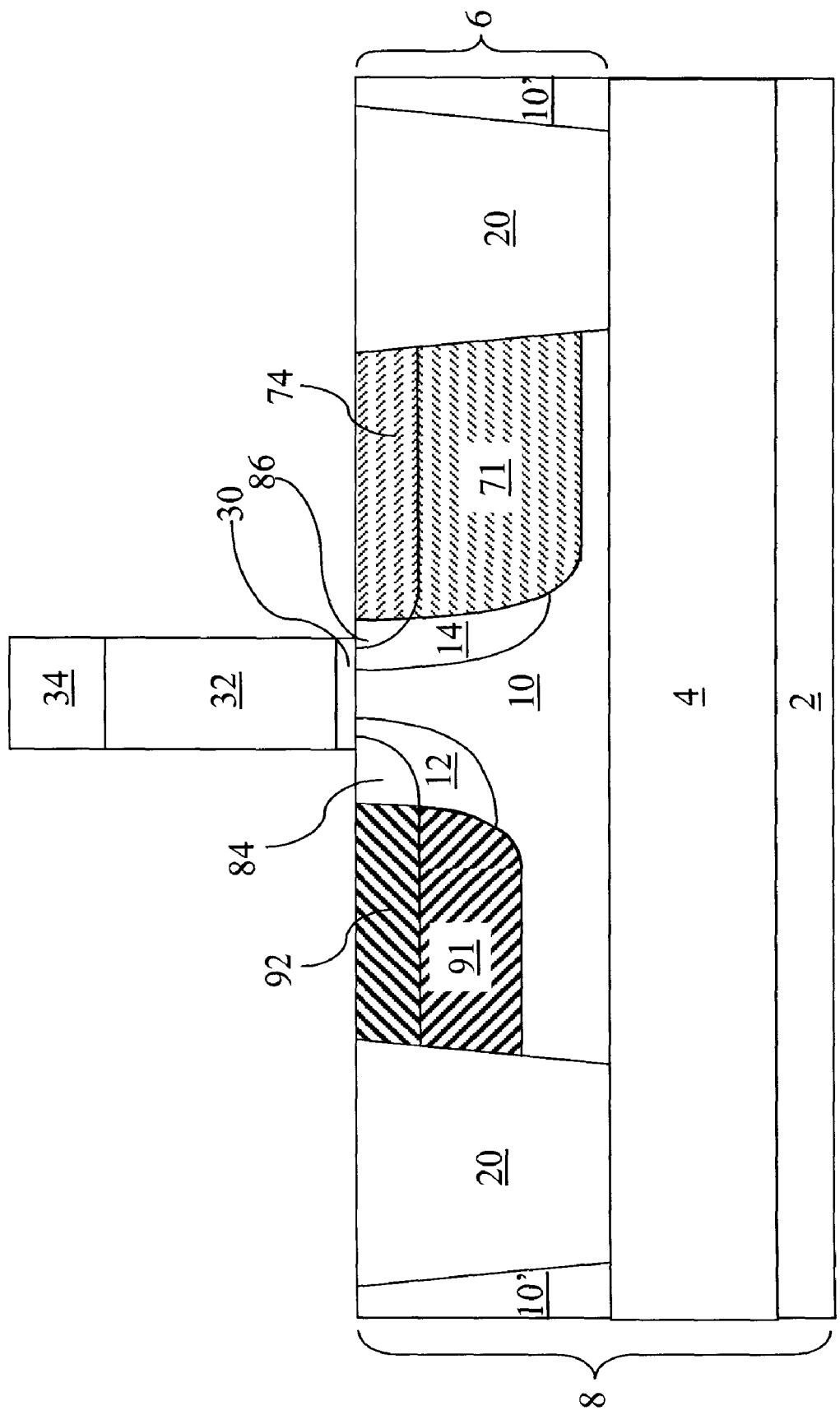

Referring to FIG. 15, the second gate spacer 44 is removed, for example, by a wet etch. Dopants of a second conductivity type are implanted into the exposed semiconductor portions by a source and drain extension ion implantation. The second conductivity type is the opposite of the first conductivity type. For example, the first conductivity type may be p-type and the second conductivity type may be n-type, or vice versa.

A top portion of the source side halo region 12 becomes a first source extension portion 84 having a doping of the second conductivity type. A top portion of the silicon germanium alloy region 90 (See FIG. 14) becomes a second source extension portion 92 laterally abutting the first source extension portion 84. The remaining portion of the silicon germanium alloy region 90 becomes a lower silicon germanium alloy portion 91. The second source extension portion 92 extends from a top surface of the top semiconductor layer 6 to a top surface of the lower silicon germanium alloy portion 91.

A top portion of the drain side halo region 14 becomes a first drain extension portion 86 having a doping of the second conductivity type. A top portion of the wide band gap semiconductor material region 70 (See FIG. 14) becomes a second drain extension portion 74 laterally abutting the first drain extension portion 86. The remaining portion of the wide band gap semiconductor material region 70 becomes a lower wide band gap semiconductor material portion 71. The second drain extension portion 74 extends from a top surface of the top semiconductor layer 6 to a top surface of the lower wide band gap semiconductor material portion 71.

Figure 16:
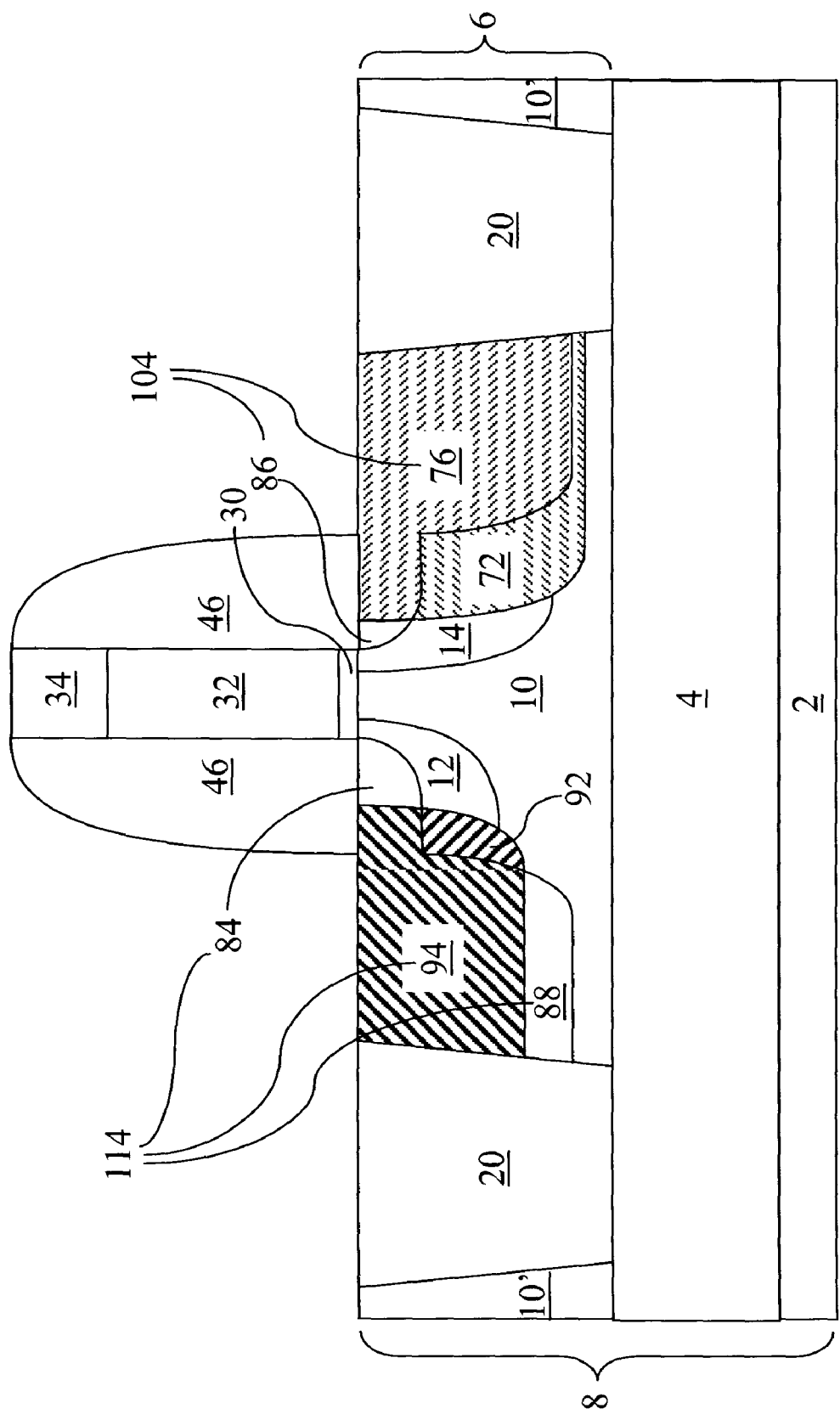

Referring to FIG. 16, a third gate spacer 46 is formed on the sidewalls of the gate dielectric 30, the gate electrode 32, and the dielectric gate cap 34 by a conformal deposition of a dielectric layer and an anisotropic etch. The third gate spacer 46 may comprise silicon oxide, silicon nitride, a dielectric metal oxide, or a dielectric metal nitride.

Dopants of the second conductivity type are implanted in a source and drain ion implantation into the region of the second source extension portion, the lower silicon germanium alloy portion 91, the second drain extension portion 74, and the lower wide band gap semiconductor material portion 71 that are not covered by the stack of the gate conductor and the gate cap or by the third gate spacer 46. The entirety of the silicon germanium alloy containing region having the second conductivity type doping is herein referred to as a silicon germanium alloy containing source portion 94, which abuts a portion of the third gate spacer 46. The portion of the silicon germanium alloy containing region having the first conductivity type doping is herein referred to as a silicon germanium alloy containing body portion 92.

The entirety of the wide band gap semiconductor material containing region having the second conductivity type doping is herein referred to as a wide band gap semiconductor material containing drain portion 76, which abuts another portion of the third gate spacer 46. The portion of the wide band gap semiconductor material containing region having the first conductivity type doping is herein referred to as a wide band gap semiconductor material containing body portion 72.

Preferably, the depth of the implanted ions during the source and drain ion implantation is less than the depth of the lower wide band gap semiconductor material portion 71 (See FIG. 15) such that a p-n junction is formed within the lower wide band gap semiconductor material portion 71. Formation of the p-n junction within the lower wide band gap semiconductor material portion 71 induces impact ionization within the wide band gap semiconductor material body portion 72 or within the wide band gap semiconductor material containing drain portion 76.

The depth of the implanted ions during the source and drain ion implantation may be less than, equal to, or greater than the depth of the bottom surface of the silicon germanium alloy containing source portion 94. In case the depth of the implanted ions is greater than the depth of the bottom surface of the silicon germanium alloy containing source portion 94, a silicon containing source portion 88 having a doping of the second conductivity type is formed directly underneath the silicon germanium alloy containing source portion 94.

Semiconductor portions having a doping of the first conductivity type collectively constitute a body of a field effect transistor. Specifically, the body comprises the semiconductor region 10 which comprises silicon, the source side halo region 12 which comprises silicon, the silicon germanium alloy containing body portion 92 which comprises the silicon germanium alloy, the drain side halo region 14 which comprises silicon, and the wide band gap semiconductor material containing body portion 72 which comprises the wide band gap semiconductor material. The first source extension portion 84 which comprises silicon, the silicon germanium alloy containing source portion 94 which comprises a silicon germanium alloy, and, if present, the silicon containing source portion 88 which comprises silicon collectively constitute a source region 114. The first drain extension portion 86 and the wide band gap semiconductor material containing drain portion 76 collectively constitute a drain region 104.

Figure 17:
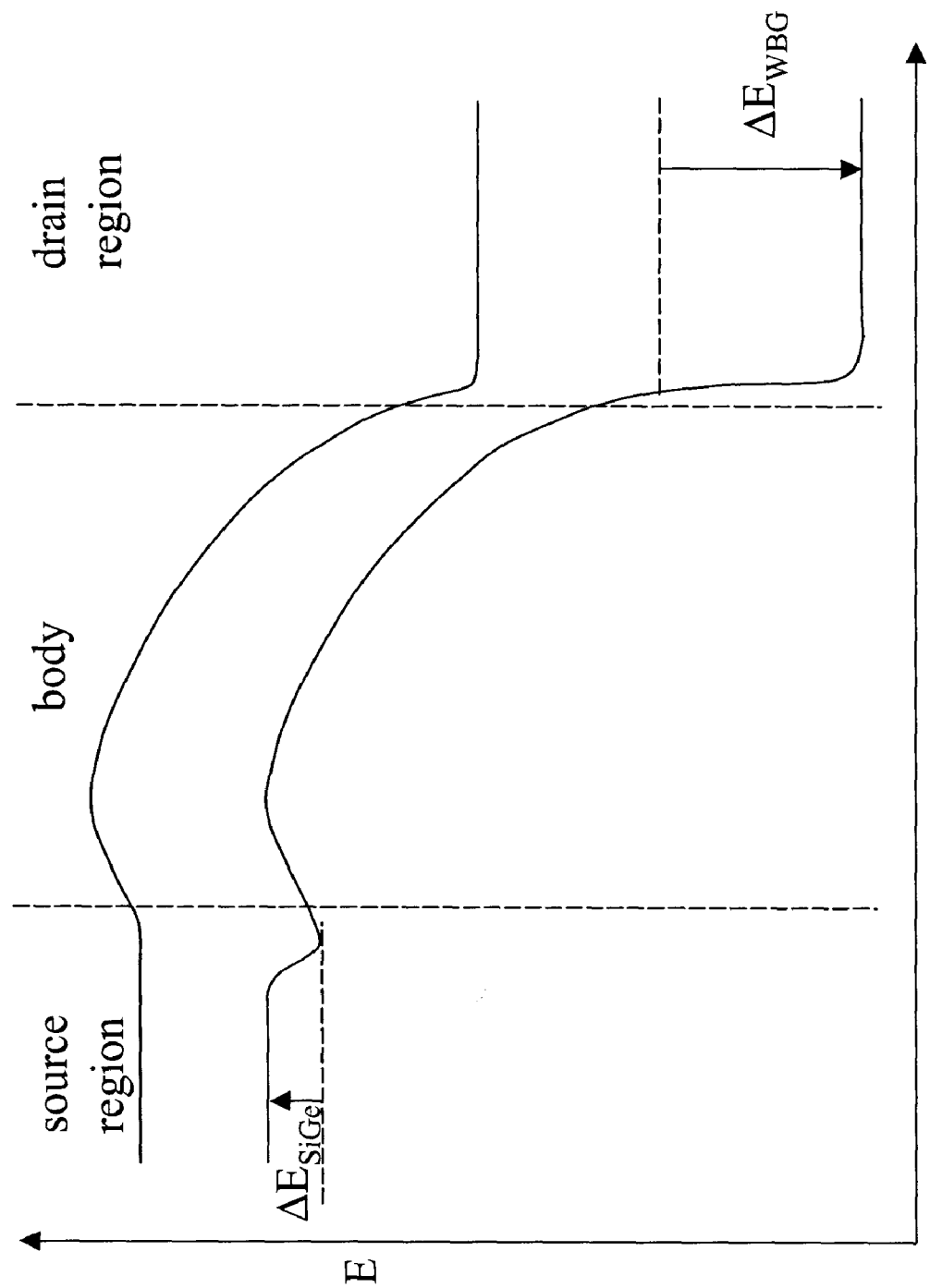

Referring to FIG. 17, a band gap diagram for the first exemplary semiconductor structure is shown across the source region, the body, and the drain region. The presence of the silicon germanium alloy in the source region alters the valence band of the band gap diagram by increasing the potential of the valence band in the source region by $\Delta E_{SiGe}$, which may be from about 0.01 eV to about 0.2 eV. This increase is beneficial to performance of the transistor by increasing the on-current of a field effect transistor. The presence of the wide band gap semiconductor material in the drain region also alters the valence band of the band gap diagram by decreasing the potential of the drain region by $\Delta E_{WBG}$, which may be from about 0.2 eV to about 4.0 eV. In the case of silicon carbide, the $\Delta E_{WBG}$ may be from about 1.6 eV to about 2.7 eV. The resulting increase in the band gap in the drain region suppresses impact ionization since charge carriers require a higher energy to generate secondary electron-hole pairs in a wide band gap semiconductor material containing drain compared to a silicon containing drain. With the suppression of impact ionization, the breakdown voltage of the field effect transistor is increased.

Figure 18:
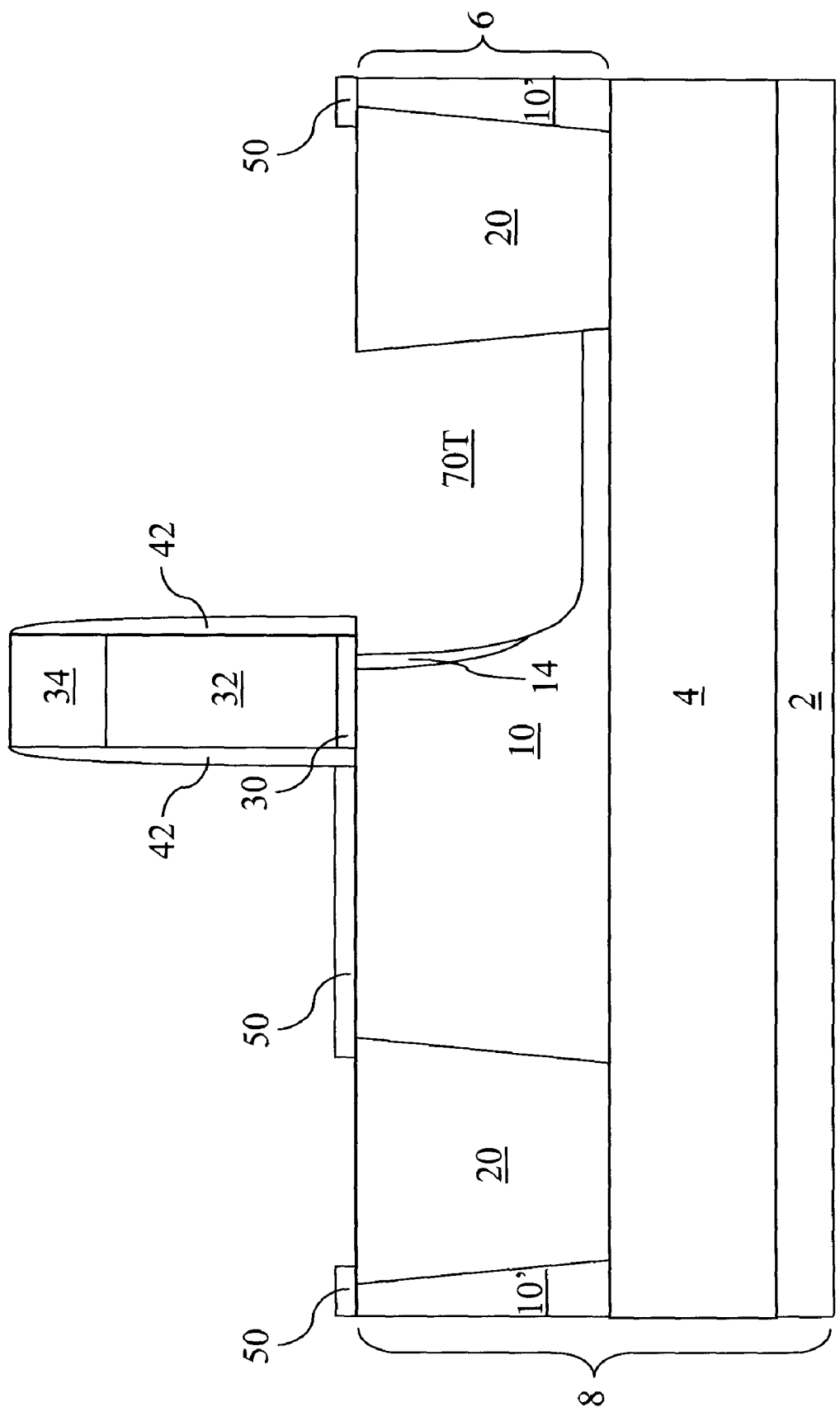
FIG. 18 is a band gap diagram for the first exemplary semiconductor structure including a source, a body, and a drain according to the present invention.

Referring to FIG. 18, a second exemplary semiconductor structure according to a second embodiment of the present invention is derived from the first exemplary semiconductor of FIG. 4 by a later etch of the drain side halo region 14. Such a lateral etch may be effected by adding an isotropic component to the reactive ion etch during the formation of the drain side trench 70T. A bottom surface of the first gate spacer 42 and a bottom surface of the gate dielectric 30 are undercut and exposed after the lateral etch of the drain side halo region 14.

Figure 19:
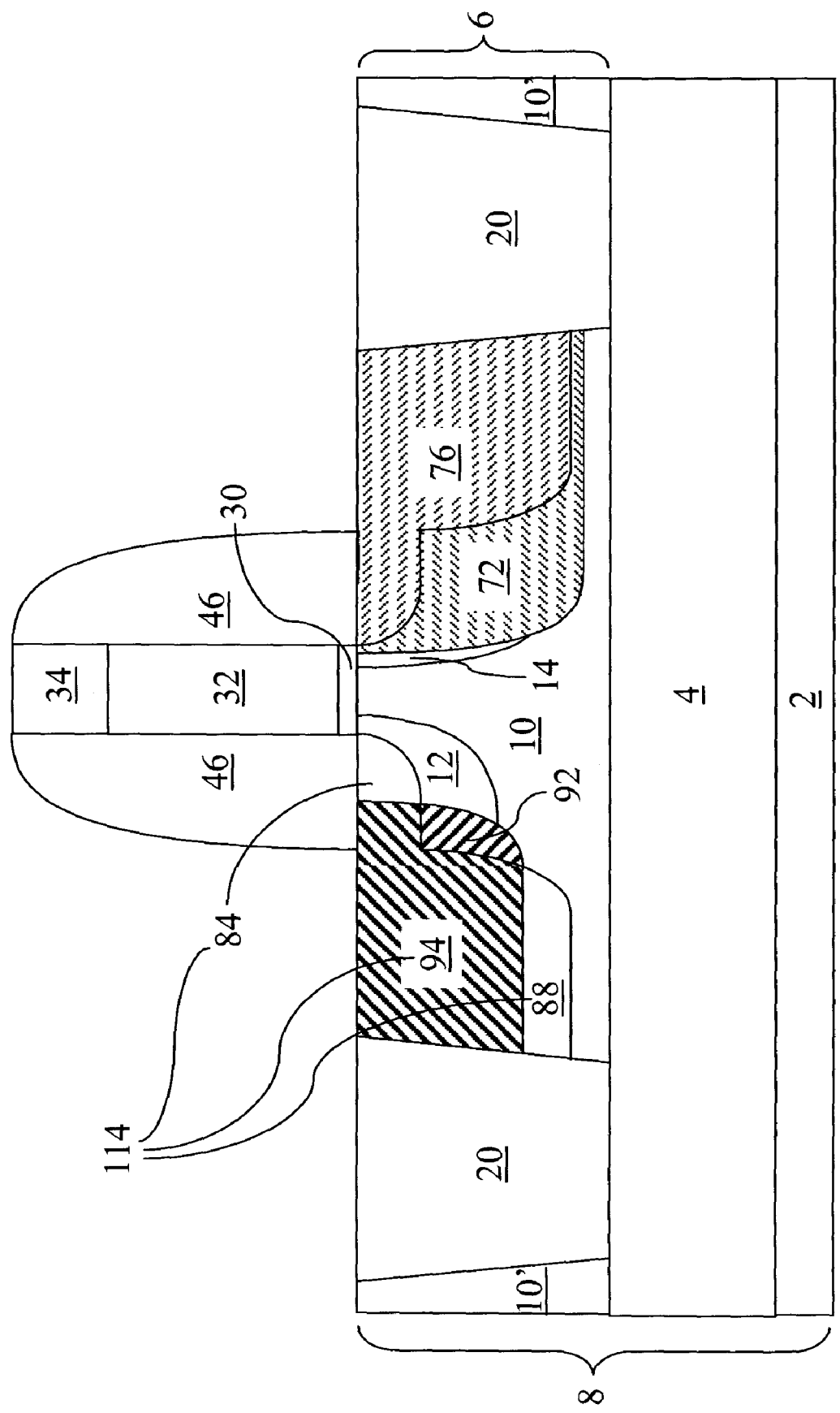

Referring to FIG. 19, the processing steps of the first embodiment are subsequently performed up to the step corresponding to FIG. 16. In the second embodiment, however, a drain extension region is formed entirely within a wide band gap semiconductor material region 70. In other words, the drain extension region does not extend outside the wide band gap semiconductor material region 70. Thus, the wide band gap semiconductor material body portion 72 abuts the gate dielectric 30. In the second exemplary semiconductor structure, the wide band gap semiconductor material containing drain portion 76 is a drain region.

Figure 20:
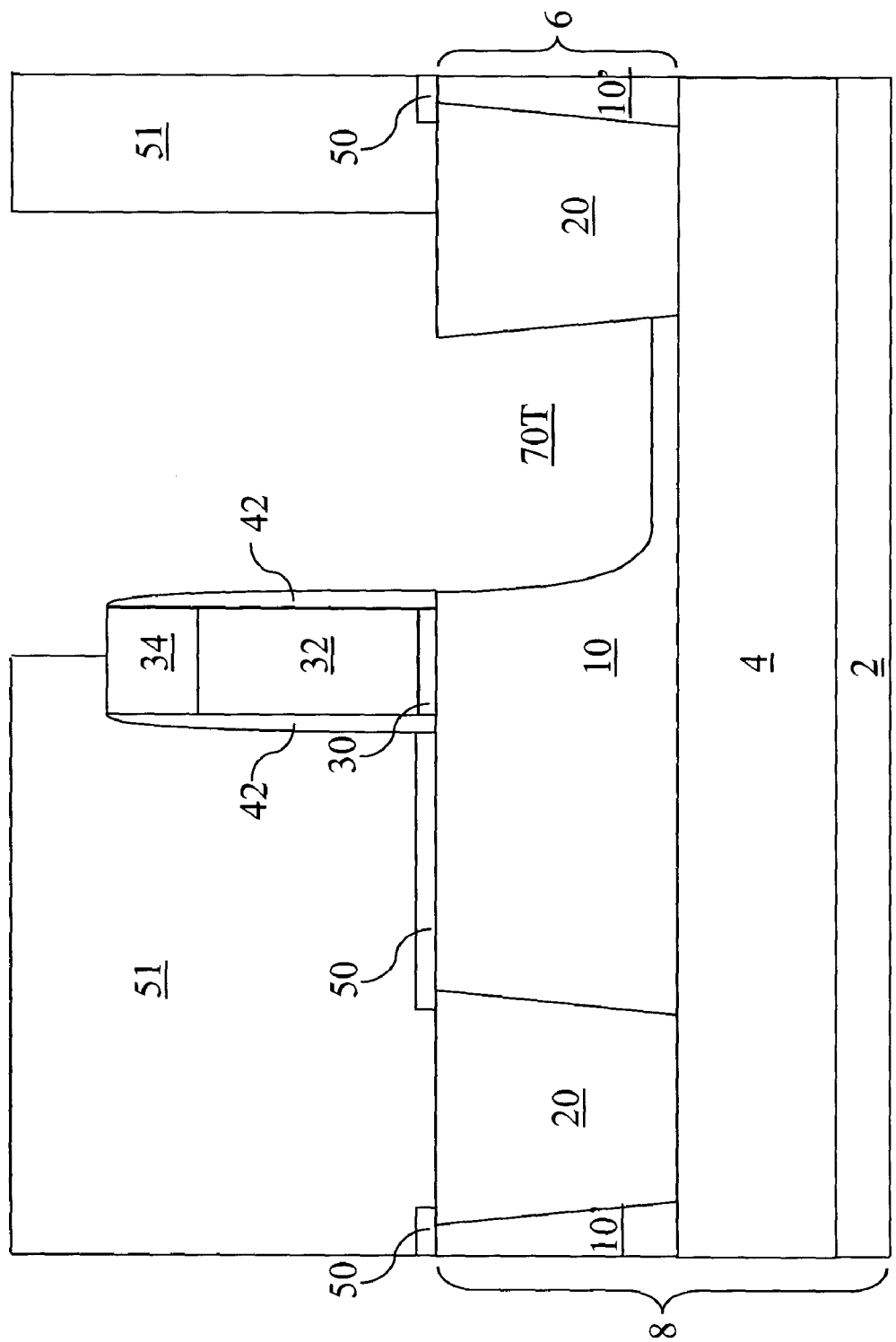
FIGS. 20-22 are sequential vertical cross-sectional view of a third exemplary semiconductor structure according to a third embodiment of the present invention.

Referring to FIG. 20, a third exemplary semiconductor structure according to a third embodiment of the present invention is derived from the first exemplary semiconductor structure by omitting formation of the drain side halo region 14 through the opening O in the first photoresist 51 shown in FIG. 3. A drain side trench 70T is formed as in FIG. 4 of the first embodiment.

Figure 21:
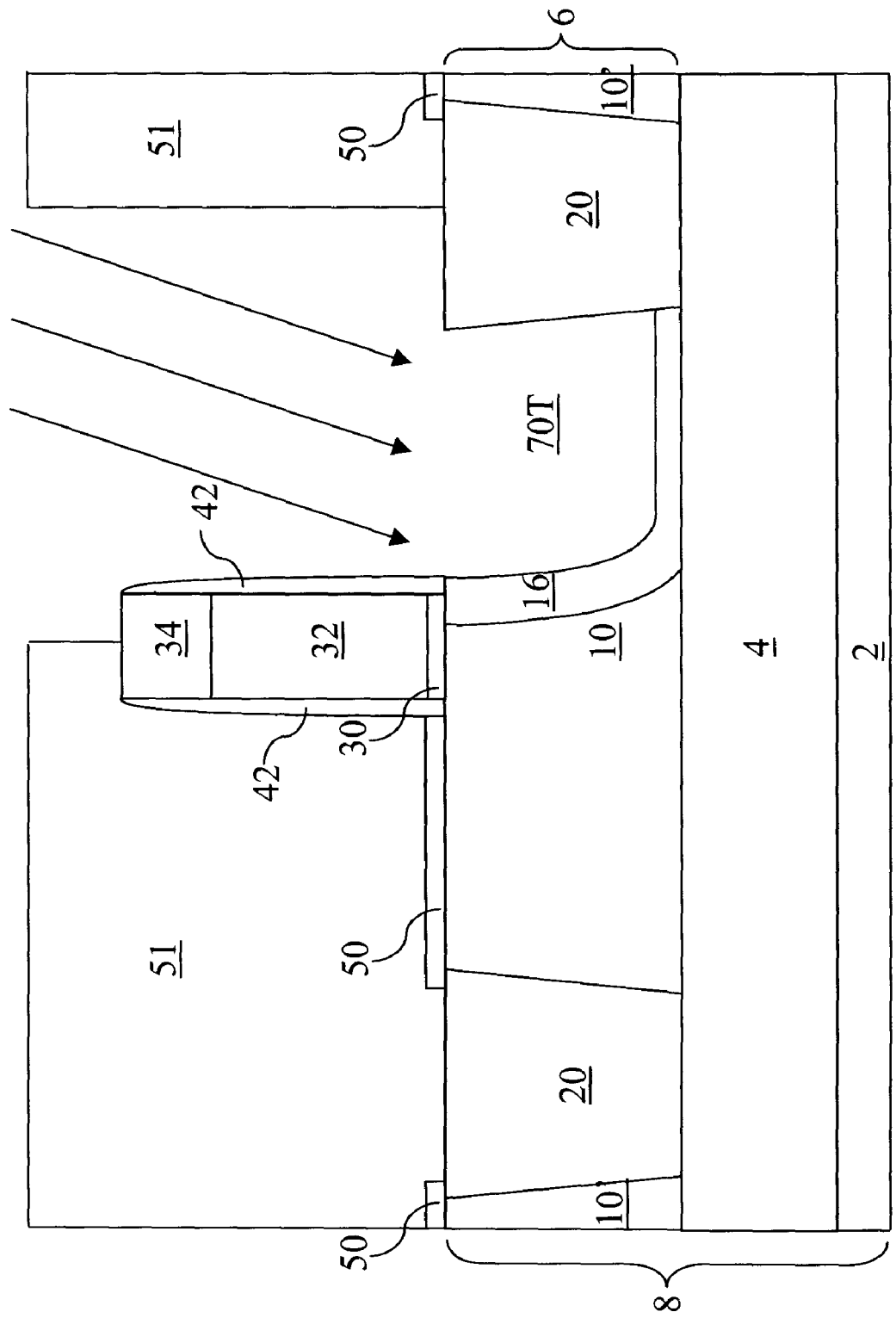

Referring to FIG. 21, a deep drain side halo region 16 is formed after formation of the drain side trench 70T by implanting dopants of the first conductivity type through the bottom surface and the sidewall of the drain side trench 70T. The deep drain side halo region 16 may extend from a bottom surface of the gate dielectric 30 to a top surface of the buried insulator layer 4.

Figure 22:
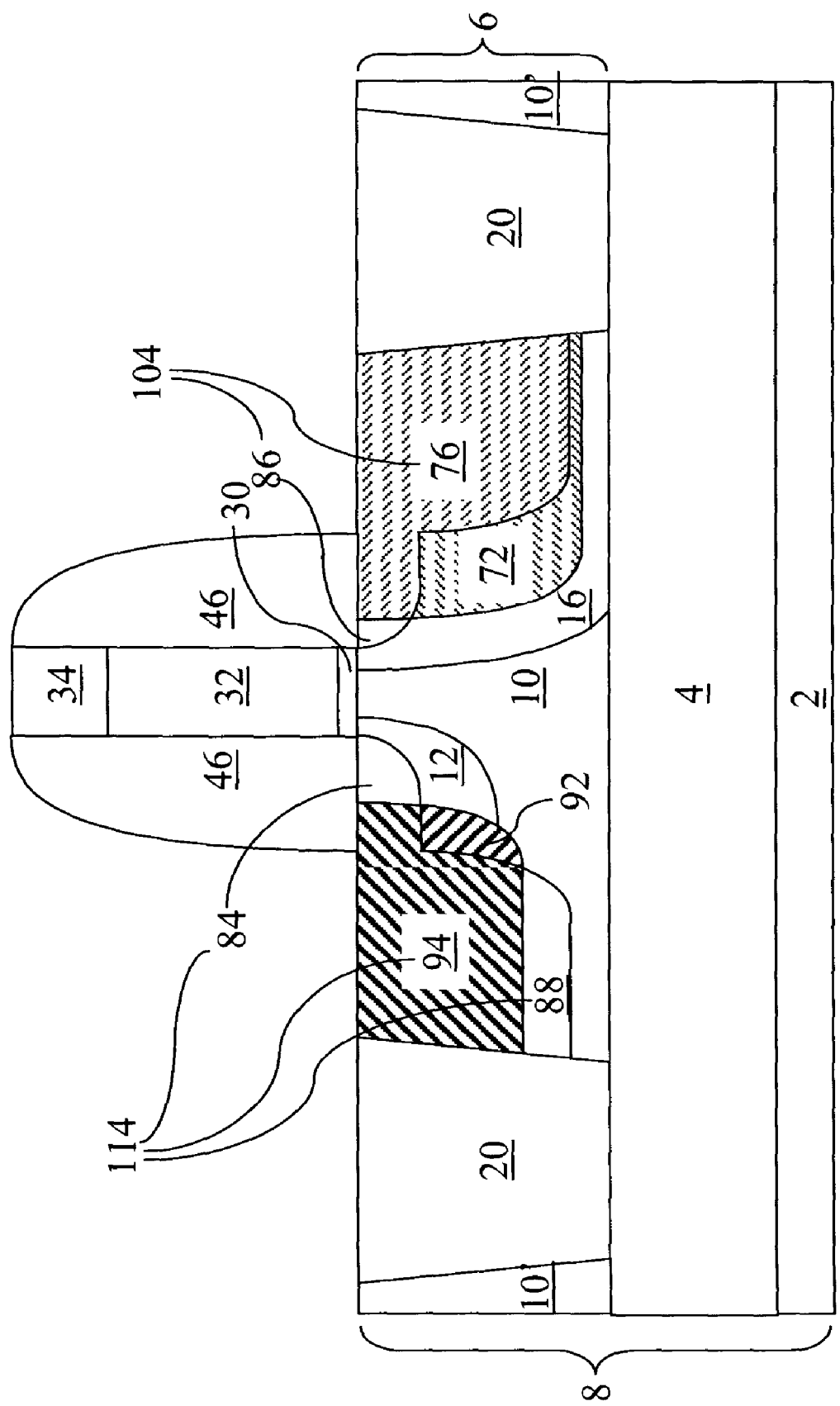

Referring to FIG. 22, the processing steps of the first embodiment are subsequently performed up to the step corresponding to FIG. 16. In the third embodiment, the body comprises the semiconductor region 10 which comprises silicon, the source side halo region 12 which comprises silicon, the silicon germanium alloy containing body portion 92 which comprises the silicon germanium alloy, the deep drain side halo region 16 which comprises silicon and abuts the gate dielectric 32 and the buried insulator layer 16, and the wide band gap semiconductor material containing body portion 72 which comprises the wide band gap semiconductor material.

Figure 23:
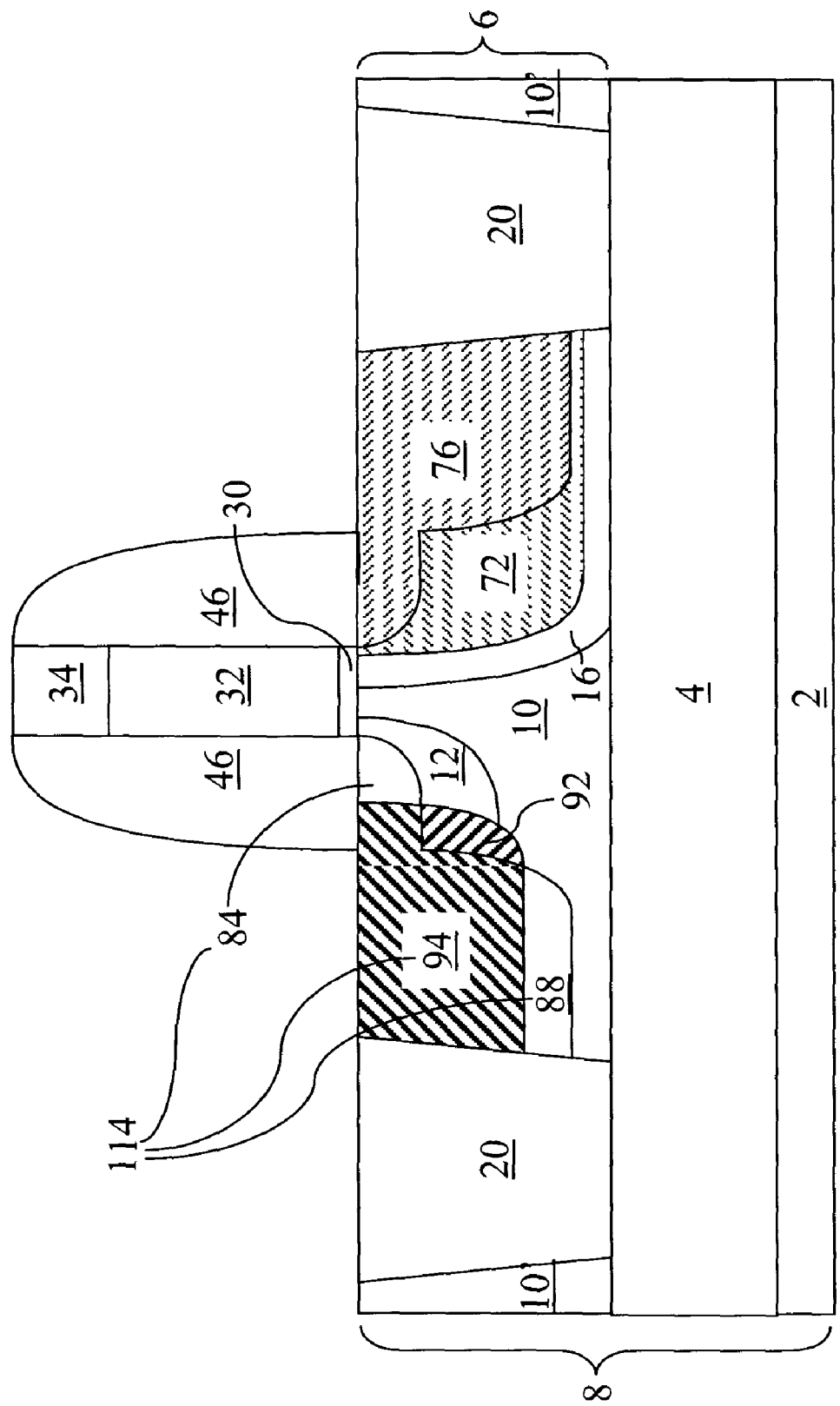
FIG. 23 is a vertical cross-sectional view of a fourth exemplary semiconductor structure according to a fourth embodiment of the present invention.

Referring to FIG. 23, a fourth exemplary semiconductor structure according to a fourth embodiment of the present invention omits formation of a drain side halo region 14 as in the third embodiment, and employs lateral etching of the semiconductor region 10 as in the second embodiment. Further, a deep drain side halo region 16 is formed after formation of the drain side trench 70T as in the third embodiment.

In the fourth embodiment, the body comprises the semiconductor region 10 which comprises silicon, the source side halo region 12 which comprises silicon, the silicon germanium alloy containing body portion 92 which comprises the silicon germanium alloy, the deep drain side halo region 16 which comprises silicon and abuts the gate dielectric 32 and the buried insulator layer 16, and the wide band gap semiconductor material containing body portion 72 which comprises the wide band gap semiconductor material as in the third embodiment. A drain extension region is formed entirely within a wide band gap semiconductor material region 70. The wide band gap semiconductor material body portion 72 abuts the gate dielectric 30. The wide band gap semiconductor material containing drain portion 76 is a drain region as in the second embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A field effect transistor comprising:
    a body having a doping of a first conductivity type located atop a buried insulator, said body including a silicon body portion having at least a region that is laterally positioned between a wide band gap semiconductor material containing body portion and a silicon germanium alloy containing body portion;
    a gate dielectric located on an upper surface of said silicon body portion;
    a drain region including a wide band gap semiconductor material containing drain portion located at least within an upper region of said wide band gap semiconductor material containing body portion, wherein said wide band gap semiconductor material containing body portion and said wide band gap semiconductor material containing drain portion comprises a semiconductor material having a wider band gap than silicon and wherein said silicon body portion has an upper surface in direct contact with a lower surface of said gate dielectric and wherein no portions of the wide band gap semiconductor material containing body portion and said silicon germanium alloy containing body portion are in direct contact with said lower surface of said gate dielectric, and
    wherein a lower boundary of said wide band gap semiconductor material containing drain portion does not extend below a lower boundary of said wide band gap semiconductor material containing body portion; and
    a source region including a silicon-germanium alloy containing source portion and located laterally adjacent said body, wherein said silicon-germanium alloy containing source portion and said wide band gap semiconductor material containing body portion are not in contact with said buried insulator.

2. The field effect transistor of claim 1, wherein said drain region further contains a silicon containing drain portion located beneath said gate dielectric.

3. The field effect transistor of claim 1, wherein said wide band gap semiconductor material containing body portion is located beneath said gate dielectric.

4. The field effect transistor of claim 1, wherein said body further includes a drain side halo region that is located laterally adjacent said wide band gap semiconductor material containing body portion and beneath said gate dielectric.

5. The field effect transistor of claim 1, wherein said source region further comprises a silicon containing source portion located beneath said gate dielectric.

6. The field effect transistor of claim 1, wherein said body further includes a source side halo region that is located laterally adjacent said silicon-germanium alloy containing source portion.

7. The field effect transistor of claim 1, further comprising:
    a handle substrate located directly beneath said buried insulator layer.

8. The field effect transistor of claim 1, wherein said wide band gap semiconductor material containing body portion and said wide band gap semiconductor material containing drain portion comprise stoichiometric silicon carbide in which an atomic ratio between silicon and carbon is substantially 1.

9. The field effect transistor of claim 1, wherein said wide band gap semiconductor material containing body portion and said wide band gap semiconductor material containing drain portion comprise one of gallium nitride, aluminum nitride, boron nitride, and diamond.

10. The field effect transistor of claim 1, wherein said silicon-germanium alloy containing source portion has a doping of a second conductivity type, said silicon-germanium alloy containing source portion is located at least within a region of said silicon germanium alloy containing body portion, wherein said second conductivity type is the opposite of the first conductivity type.

11. The field effect transistor of claim 1, further comprising a gate spacer that is located above said silicon-germanium alloy containing source portion.

12. The field effect transistor of claim 1, wherein no portion of the drain region is in direct contact with said buried insulator.

13. The field effect transistor of claim 1, wherein no portion of the source region is in direct contact with said buried insulator.

14. The field effect transistor of claim 1, further comprising a shallow trench isolation region located adjacent to said body and having a lower surface in direct contact with an upper surface of said buried insulator.

* * * * *